(12) United States Patent
Inoue et al.

(10) Patent No.: US 8,779,434 B2
(45) Date of Patent: Jul. 15, 2014

(54) THIN FILM TRANSISTOR ARRAY AND DISPLAYING APPARATUS

(75) Inventors: Takao Inoue, Kanagawa (JP); Takumi Yamaga, Kanagawa (JP); Atsushi Onodera, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 394 days.

(21) Appl. No.: 12/246,134

(22) Filed: Oct. 6, 2008

(65) Prior Publication Data
US 2009/0095958 A1 Apr. 16, 2009

(30) Foreign Application Priority Data
Oct. 15, 2007 (JP) ................................ 2007-267845

(51) Int. Cl.
*H01L 27/14* (2006.01)
*H01L 29/417* (2006.01)

(52) U.S. Cl.
CPC .............................. *H01L 29/41733* (2013.01)
USPC ................ 257/72; 438/48; 438/128; 438/149

(58) Field of Classification Search
CPC .................................................. H01L 29/41733
USPC .......... 257/88, E25.01, E25.011, E25.012, 72
See application file for complete search history.

(56) References Cited

U.S. PATENT DOCUMENTS

| | | | | |
|---|---|---|---|---|
| 5,541,748 A * | 7/1996 | Ono et al. | ........................ | 349/42 |
| 2001/0013915 A1 * | 8/2001 | Song | .............................. | 349/141 |
| 2001/0053570 A1 * | 12/2001 | Kido | .............................. | 438/149 |
| 2002/0079501 A1 * | 6/2002 | Okada et al. | ..................... | 257/88 |
| 2002/0105614 A1 | 8/2002 | Nakayama et al. | | |
| 2003/0107696 A1 | 6/2003 | Song | | |
| 2005/0023557 A1 | 2/2005 | Okada et al. | | |
| 2005/0173701 A1 | 8/2005 | Kawase et al. | | |
| 2006/0231840 A1 | 10/2006 | Okada et al. | | |
| 2006/0240603 A1 | 10/2006 | Mathea et al. | | |
| 2006/0290858 A1 | 12/2006 | Lai | | |
| 2008/0048968 A1 | 2/2008 | Okada et al. | | |

(Continued)

FOREIGN PATENT DOCUMENTS

| | | |
|---|---|---|
| JP | 7-325314 | 12/1995 |
| JP | 09-260675 | 10/1997 |

(Continued)

OTHER PUBLICATIONS

English translation (machine translation) of IDS reference JP2005-260192A to Kawase disclosed by applicant in Information Disclosure Statement of May 3, 2013.*

(Continued)

*Primary Examiner* — Ajay K Arora
(74) *Attorney, Agent, or Firm* — Cooper & Dunham LLP

(57) ABSTRACT

A thin film transistor array is disclosed. The thin film transistor array includes plural gate electrodes formed on an insulation substrate, plural source electrodes formed above or under the gate electrodes via a gate insulation film so that the source electrodes cross the gate electrodes in a planar view, plural drain electrodes formed at corresponding positions surrounded by the gate electrodes and the source electrodes in a planar view in the same layer as that of the source electrodes, semiconductor layers formed via the gate insulation film to face the gate electrodes for forming corresponding channel regions between the source electrodes and the drain electrodes. The plural gate electrodes are linearly formed, and the channel regions are disposed to face the gate electrodes.

8 Claims, 16 Drawing Sheets

(56) References Cited

U.S. PATENT DOCUMENTS

| | | |
|---|---|---|
| 2009/0026457 A1 | 1/2009 | Okada et al. |
| 2010/0167443 A1 | 7/2010 | Okada et al. |
| 2011/0003417 A1 | 1/2011 | Okada et al. |

FOREIGN PATENT DOCUMENTS

| | | |
|---|---|---|
| JP | 2005-260192 | 9/2005 |
| JP | 2006-516754 | 7/2006 |
| JP | 2007-266252 | 10/2007 |
| JP | 2008-66567 | 3/2008 |
| TW | 583490 | 4/2004 |
| TW | 1256495 | 6/2006 |
| TW | 1286386 | 9/2007 |
| TW | 1287296 | 9/2007 |

OTHER PUBLICATIONS

Japanese official action dated Oct. 16, 2012 in corresponding Japanese patent application No. 2007-267845.

Taiwanese official action dated Nov. 5, 2012 in connection with corresponding Taiwanese patent application No. 097139215.

European search report dated Sep. 17, 2012 in connection with corresponding European patent application No. 08253286.2.

* cited by examiner

FIG.1
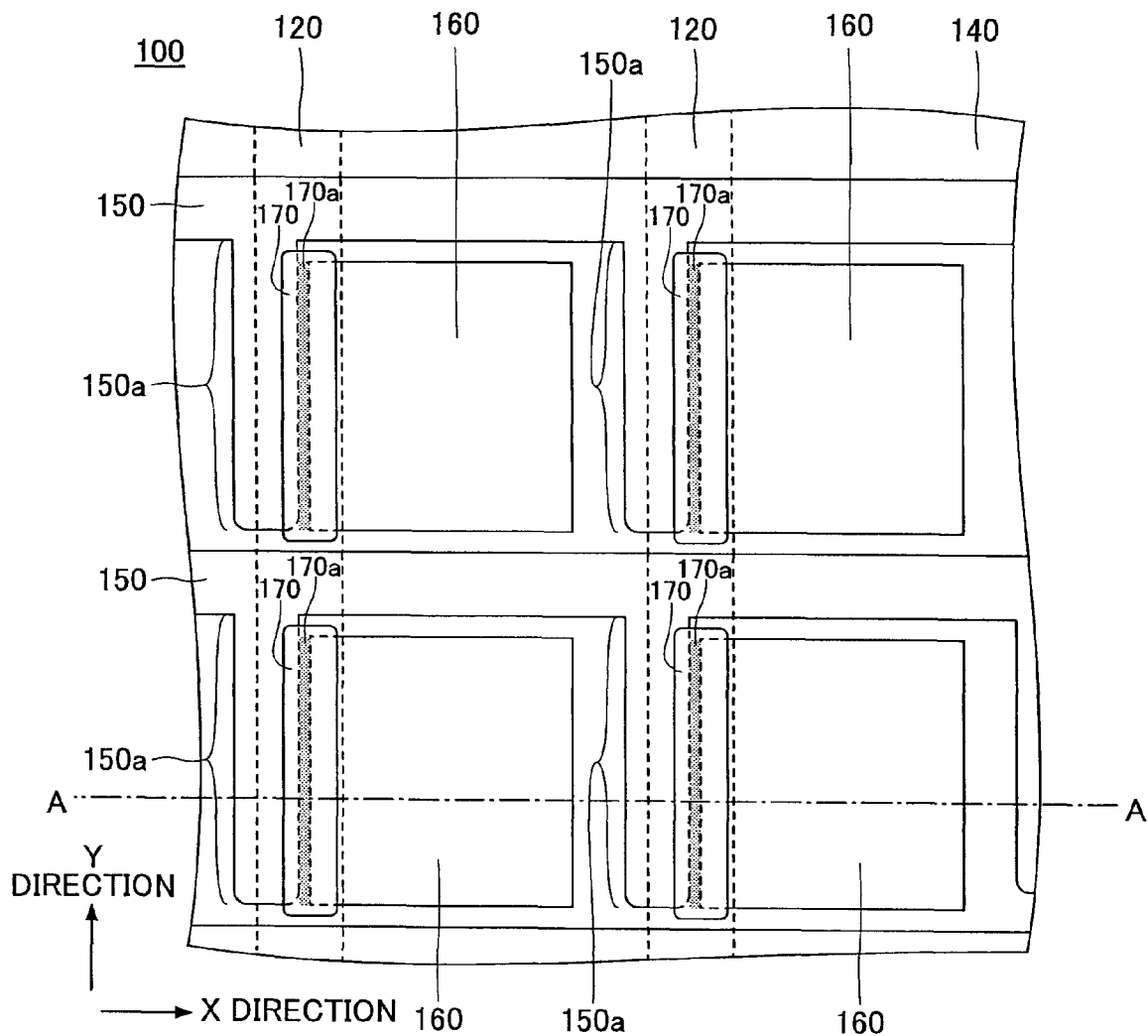
(a)
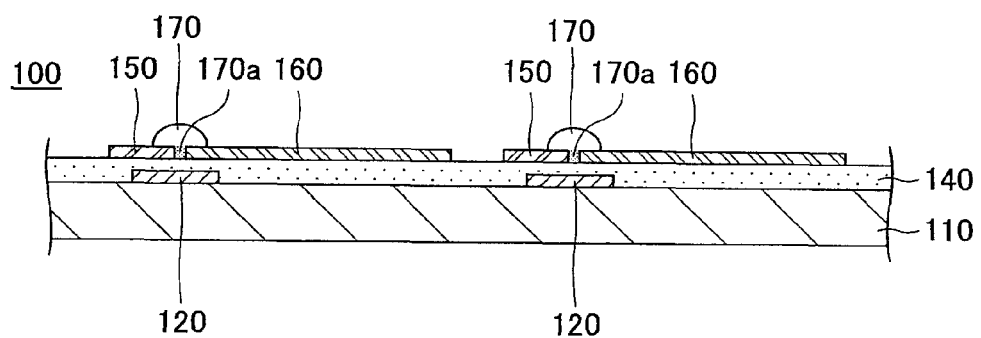
(b)

FIG.3
(a)
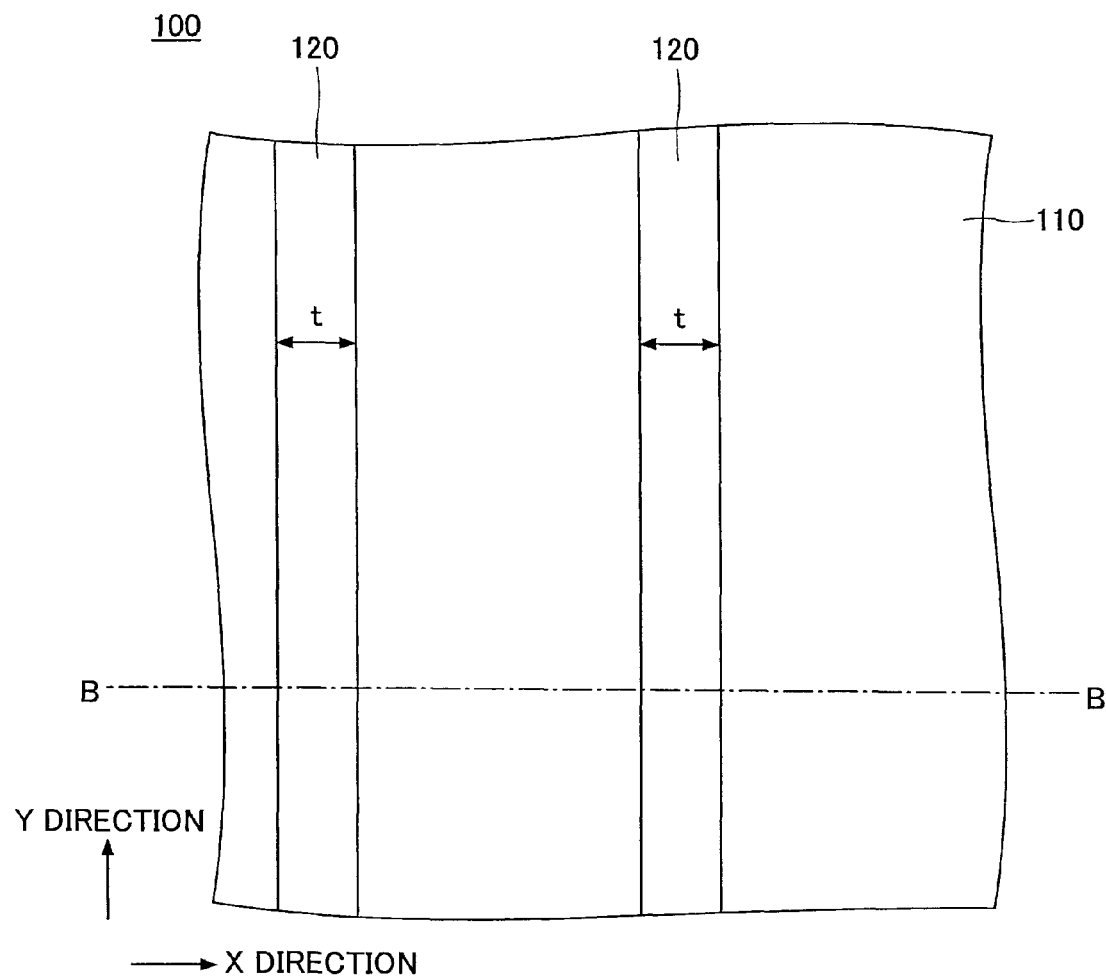
Y DIRECTION
X DIRECTION
(b)
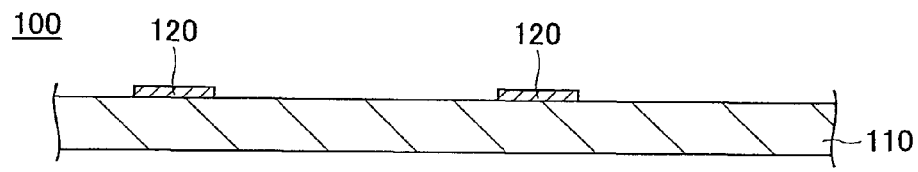

FIG.11
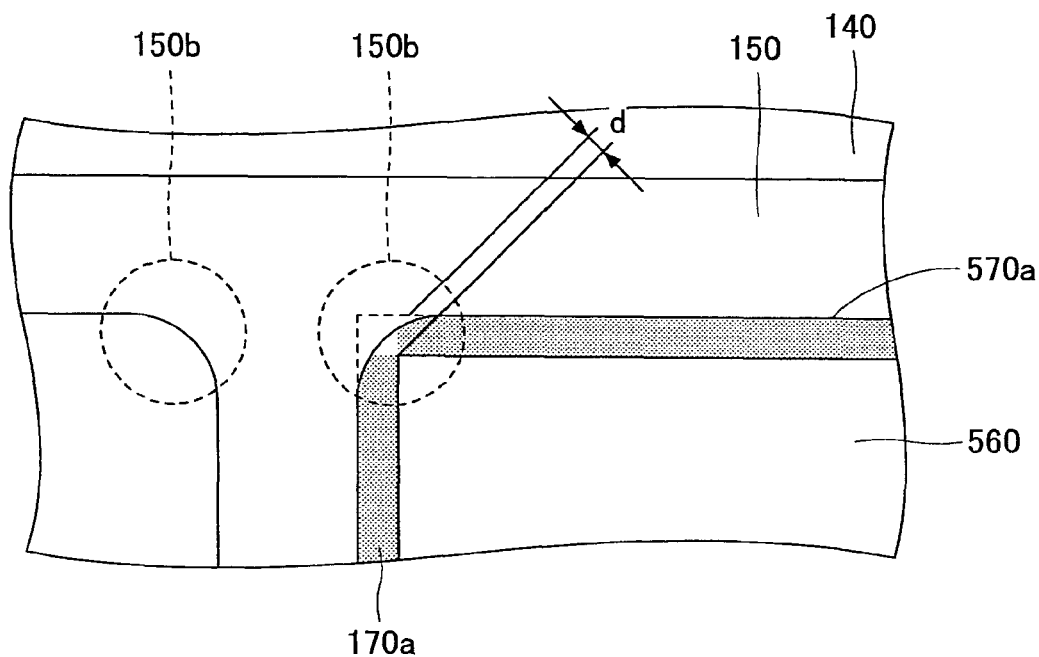
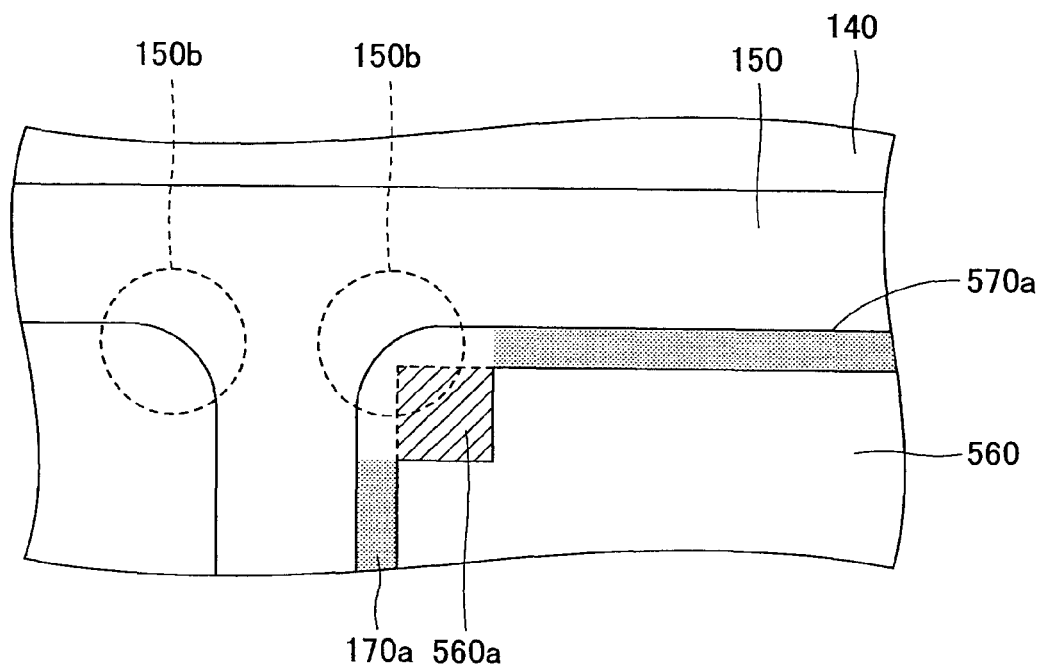

THIN FILM TRANSISTOR ARRAY AND DISPLAYING APPARATUS

BACKGROUND

1. Technical Field

This disclosure generally relates to a thin film transistor array and a displaying apparatus using the thin film transistor array.

2. Description of the Related Art

A displaying apparatus using a thin film transistor array (TFT array) has been widely used, and in many case, a pattern of the thin film transistor array is generally formed by a photolithography method.

The photolithography method includes the following processes.

A. A resist applying process in which a photoresist layer is applied onto a substrate having a thin film layer.

B. A pre-baking process in which a solvent on the substrate is removed by baking.

C. An exposing process in which ultraviolet rays are irradiated onto the substrate via a hard mask formed by a laser beam or an electron beam based on pattern data.

D. A developing process in which the resist on an exposed section is removed by using an alkali solution.

E. A post-baking process in which the resist at the unexposed section (pattern part) is hardened by baking.

F. An etching process in which a part of the thin film layer where the resist has not been covered is removed by soaking into an etching liquid or exposing in an etching gas.

G. A resist removing process in which the resist is removed by using an alkali solution or oxygen radical.

When the photolithography method is used, a micro pattern of tens of nm can be formed; however, cost is high due to high-priced equipment and long processes.

In order to reduce the cost, a pattern has been formed by using a printing method such as an inkjet printing method, an aerosol printing method, and an offset printing method, and a thin film transistor array has been formed (refer to Patent Document 1).

First, a conventional thin film transistor array is described. The conventional thin film transistor array has a structure shown in FIG. 15 regardless of using a photolithography method or a printing method for forming a pattern. FIG. 15 is a structural diagram of a conventional thin film transistor array 10. FIG. 15(a) shows a plan view and FIG. 15(b) shows a cross-sectional view along line I-I of FIG. 15 (a). As shown in FIG. 15, the thin film transistor array 10 provides an insulation substrate 11, gate electrodes 12, a gate insulation film 14, source electrodes 15, drain electrodes 16, semiconductor layers 17, and channel regions 17a. In addition, the gate electrode 12 provides a branching section 12a. In FIG. 15, the lengthwise (long length) direction of the source electrode 15 is in the X direction, and the lengthwise direction of the gate electrode 12 is in the Y direction.

The plural gate electrodes 12 are formed by having an approximately constant interval among them on the insulation substrate 11. In order to form the channel regions 17a (described below in detail), each of the plural gate electrodes 12 provides the branching section 12a which branches in an approximately perpendicular direction relative to the direction of the gate electrode 12. For example, in a displaying apparatus, the plural gate electrodes 12 protrude from the thin film transistor array 10 in one direction, are connected to a gate driver IC (not shown) for a scanning signal, and a selection signal is sequentially supplied to the gate electrodes 12.

The gate insulation film 14 is formed on the gate electrodes 12. The plural source electrodes 15 are formed on the gate insulation film 14 by having an approximately constant interval among them so that the plural source electrodes 15 cross the plural gate electrodes 12 in the planar view.

For example, in a displaying apparatus, the plural source electrodes 15 protrude from the thin film transistor array 10 in one direction, are connected to a source driver IC (not shown) for a data signal, and the data signal is supplied to the source electrodes 15.

The plural drain electrodes 16 are formed in regions surrounded by the corresponding plural gate electrodes 12 and the corresponding source electrodes 15 in the planar view on the same layer on which the source electrodes 15 are formed. The semiconductor layer 17 is formed on the source electrode 15 and the drain electrode 16.

The channel region 17a is formed in the semiconductor layer 17 at a position where the source electrode 15 faces the drain electrode 16. When a voltage is applied to the gate electrode 12, electrons (or holes) in the semiconductor layer 17 connected to the source electrode 15 and the drain electrode 16 are extracted to a position directly below the branching section 12a of the gate electrode 12, and the source electrode 15 is electrically connected to the drain electrode 16. That is, an electron (hole) flowing region is called a channel region.

In addition, in the channel region 17a, a length of the channel region 17a at a position where the source electrode 15 faces the drain electrode 16 is called a channel width (the X direction in FIG. 15), and an interval between the source electrode 15 and the drain electrode 16 is called a channel length (the Y direction in FIG. 15). The branching section 12a of the gate electrode 12 must be under the channel region 17a so that an electric field is applied to the channel region 17a.

The gate insulation film 14 insulates the gate electrode 12 from the source electrode 15 and the drain electrode 16, and turns on/off the thin film transistor array 10 by applying an electric field applied to the gate electrode 12 to the channel region 17a formed between the source electrode 15 and the drain electrode 16.

In the conventional thin film transistor array 10, in order to form the channel region 17a, the branching section 12a which branches in an approximately perpendicular direction relative to the direction of the gate electrode 12 is formed regardless of using a photolithography method or a printing method for forming a pattern.

[Patent Document 1] Japanese Translation of PCT International Application No. 2006-516754

However, as shown in FIG. 15, the gate insulation film 14 is formed between the gate electrode 12 and the source electrode 15 (the drain electrode 16); therefore, the gate electrode 12 and the source electrode 15 (the drain electrode 16) are separately formed.

In addition, as described above, the branching section 12a of the gate electrode 12 must be under the channel region 17a so that an electric field is applied to the channel region 17a formed between the source electrode 15 and the drain electrode 16.

In order to satisfy a positional relationship between the branching section 12a of the gate electrode 12 and the channel region 17a formed between the source electrode 15 and the drain electrode 16, so-called alignment must be performed.

If the alignment is shifted in the X or Y direction of FIG. 15, the positional relationship between the branching section 12a of the gate electrode 12 and the channel region 17a formed between the source electrode 15 and the drain electrode 16 is changed. Consequently, characteristics of the thin film transistor array 10 are changed.

BRIEF SUMMARY

In an aspect of this disclosure, there is provided a thin film transistor array and a displaying apparatus using the thin film transistor array in which alignment between a gate electrode and a channel region formed between a source electrode and a drain electrode can be easily performed.

In another aspect, there is provided a thin film transistor array that includes plural gate electrodes formed on an insulation substrate, plural source electrodes formed above or under the gate electrodes via a gate insulation film so that the source electrodes cross the gate electrodes in a planar view, plural drain electrodes formed at corresponding positions surrounded by the gate electrodes and the source electrodes in a planar view in the same layer as that of the source electrodes, semiconductor layers formed via the gate insulation film to face the gate electrodes for forming corresponding channel regions between the source electrodes and the drain electrodes. The plural gate electrodes are linearly formed, and the channel regions are disposed to face the gate electrodes.

In the aforementioned device, since a gate electrode is linearly formed without having a branching section, alignment between the gate electrode and a channel region formed between a source electrode and a drain electrode can be easily performed.

BRIEF DESCRIPTION OF THE DRAWINGS

Features The aforementioned and other aspects, features and advantages will become more apparent from the following detailed description when read in conjunction with the accompanying drawings, in which:

FIG. 1 is a structural diagram of a thin film transistor array according to a first embodiment of the present invention;

FIG. 3 is a schematic diagram showing a shape of a gate electrode in the thin film transistor array shown in FIG. 1;

FIG. 11 is a schematic diagram showing corner parts of a pattern formed by a printing method;

DESCRIPTION OF THE PREFERRED EMBODIMENT

Figure 2:
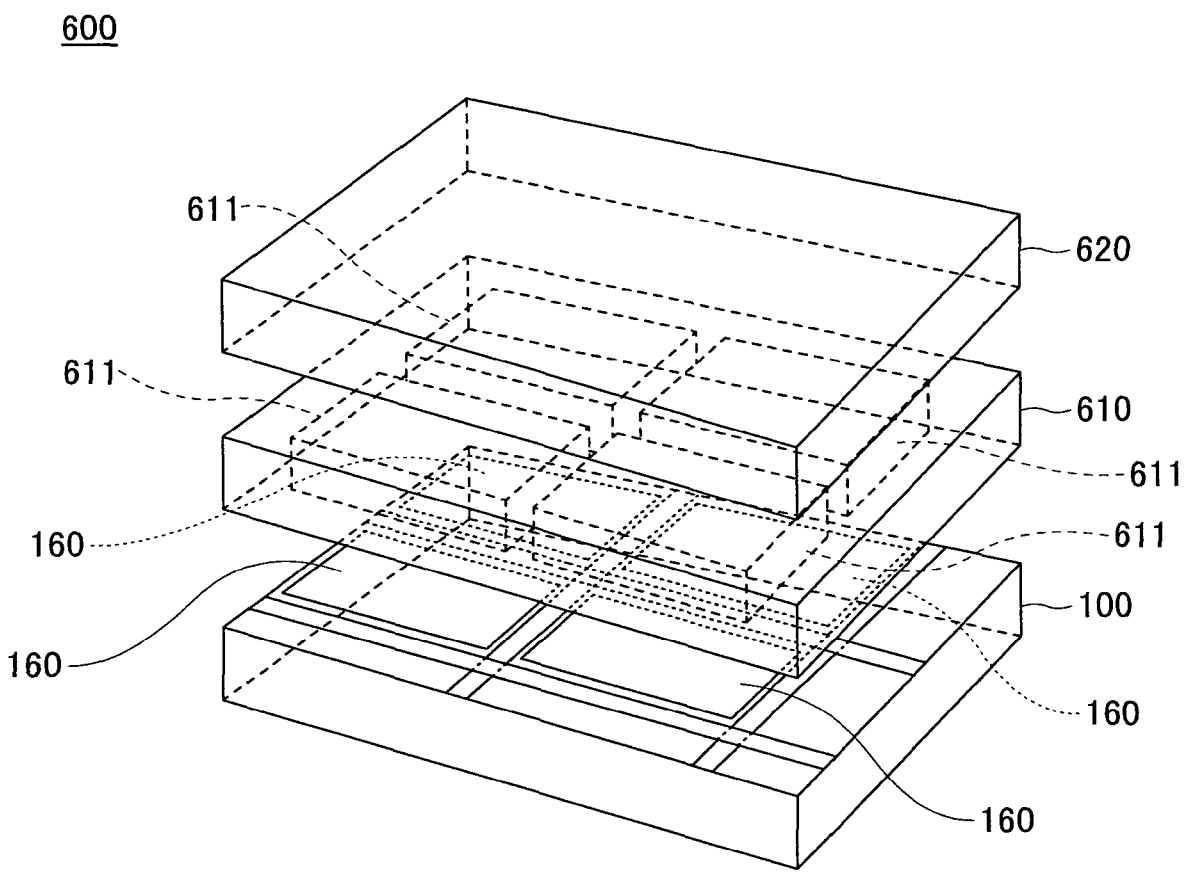
FIG. 2 is a perspective view of a liquid crystal displaying apparatus using the thin film transistor array shown in FIG. 1.

Best Mode of Carrying Out the Invention

The best mode of carrying out the present invention is described with reference to the accompanying drawings.

[First Embodiment]

FIG. 1 is a structural diagram of a thin film transistor array 100 according to a first embodiment of the present invention. FIG. 1(a) is a plan view and FIG. 1(b) is a cross-sectional view along line A-A of FIG. 1(a). The thin film transistor array 100 includes an insulation substrate 110, gate electrodes 120, a gate insulation film 140, source electrodes 150, drain electrodes 160, semiconductor layers 170, and channel regions 170a. In addition, the source electrode 150 includes a branching section 150a. In FIG. 1, the lengthwise direction of the source electrode 150 is in the X direction, and the lengthwise direction of the gate electrode 120 is in the Y direction. Further, the thin film transistor array 100 can be used in, for example, a LCD (liquid crystal display).

In the thin film transistor array 100, the plural gate electrodes 120 are formed by having an approximately constant interval among them on the insulation substrate 110. When the gate electrode 120 is compared with the gate electrode 12 shown in FIG. 15, the gate electrode 12 includes the branching section 12a; however, the gate electrode 120 does not include a branching section and is linearly formed. When the thin film transistor array 100 is used in a displaying apparatus, the plural gate electrodes 120 protrude in one direction from the thin film transistor array 100 and are connected to a gate driver IC for a scanning signal, and a selection signal is sequentially supplied to the gate electrode 120.

The gate insulation film 140 is formed on the gate electrodes 120. The plural source electrodes 150 are formed by having an approximately constant interval among them on the gate insulation film 140, and the plural source electrodes 150 cross the plural gate electrodes 120 in the planar view. The source electrode 150 includes the branching section 150a which branches in an approximately perpendicular direction relative to the direction of the source electrode 150 so that the channel region 170a is formed. When the thin film transistor array 100 is used in a displaying apparatus, the plural source electrodes 150 protrude in one direction from the thin film transistor array 100 and are connected to a driver IC for a data signal, and the data signal is supplied to the source electrode 150.

The drain electrode 160 is formed at a position surrounded by the gate electrodes 120 and the source electrodes 150 in the planar view on the gate insulation film 140 (in the same layer as that of the source electrode 150). When the thin film transistor array 100 is used in a displaying apparatus, the plural drain electrodes 160 become pixel electrodes. In addition, the semiconductor layer 170 is formed on the source electrode 150 and the drain electrode 160 approximately parallel to the branching section 150a of the source electrode 150. The semiconductor layers 170 are formed at corresponding separate positions so that a leakage current between the source electrodes 150 is prevented from being generated.

In a displaying apparatus according the embodiments of the present invention, an electrode to be connected to a diver IC for a data signal is called a source electrode and a pixel electrode is called a drain electrode; however, the electrodes can be called inversely.

The channel region 170a is formed at a position where the branching section 150a of the source electrode 150 faces the drain electrode 160 under the semiconductor layer 170. The gate electrode 120 must be positioned under the channel region 170a so that an electric field is applied to the channel region 170a.

As described above, in the first embodiment of the present invention, the gate electrode 120 is linearly formed without having a branching section, the source electrode 150 includes the branching section 150a, and the channel region 170a is formed at a position where the branching section 150a of the source electrode 150 faces the drain electrode 160 under the semiconductor layer 170. That is, the above structure is different from that of the conventional thin film transistor array 10 shown in FIG. 15.

The gate insulation film 140 insulates the gate electrode 120 from the source electrode 150 and the drain electrode 160, and turns on/off the thin film transistor array 100 by applying an electric field applied to the gate electrode 120 to the channel region 170a formed between the source electrode 150 and the drain electrode 160.

FIG. 2 is a perspective view of a liquid crystal displaying apparatus 600 using the thin film transistor array 100. As shown in FIG. 2, the liquid crystal displaying apparatus 600 has a structure in which a liquid crystal layer 610 is formed at the side where the drain electrodes 160 of the thin film transistor array 100 are formed and an electrode 620 is formed on the liquid crystal layer 610. Plural pixel regions 611 are formed in the liquid crystal layer 610 having a predetermined pixel pitch among them. Each of the pixel regions 611 is formed at a position corresponding to each of the drain electrodes 160 of the thin film transistor array 100. When a desirable thin film transistor in the thin film transistor array 100 is selectively switched on/off by using a drain electrode 160 as a pixel electrode, a voltage is applied between the drain electrode 160 and the electrode 620, and a light amount to be transmitted through the liquid crystal layer 610 is adjusted. With this, the liquid crystal displaying apparatus 600 is realized.

Next, manufacturing processes of the thin film transistor array 100 are described.

FIG. 3 is a schematic diagram showing a shape of the gate electrode 120 in the thin film transistor array 100. FIG. 3(a) shows a plan view and FIG. 3(b) shows a cross-sectional view along line B-B of FIG. 3 (a).

First, the gate electrodes 120 are formed on the insulation substrate 110 by using a conductive material. As shown in FIG. 3, the gate electrodes 120 are linearly formed on the insulation substrate 110 without having a branching section. In addition, in FIG. 3, "t" indicates a line width of the gate electrode 120.

The gate electrode 120 can be formed by a so-called photoresist method. In the method, a photoresist material is applied onto a metal film formed in a vacuum, the photoresist material (film) is exposed via a photo-mask and the exposed photoresist film is developed, an etching process is applied to the developed film, and a metal film to be a wiring (the gate electrode 120) is formed. In addition, a printing method such as an inkjet printing method, an offset printing method, a gravure printing method, or a flexo printing method can be used, instead of using the photoresist method. The material of the gate electrode 120 can be a metal, for example, Au, Ag, Al, or Cu, or a conductive polymer such as PEDOT/PSS.

In addition, the gate electrodes 120 are formed approximately parallel to each other having an accurate pixel pitch interval among them. The gate electrode 120 must continue to apply a gate electric field to the channel region 170a by being positioned under the channel region 170a. Therefore, the line width "t" has a condition "the length of the channel region $170a \le t \le$ the length of the channel region $170a$+alignment accuracy in the X direction".

Next, the gate insulation film 140 is formed on the gate electrodes 120 on the insulation substrate 110. The gate insulation film 140 can be formed by applying an insulation film solution onto the gate electrodes 120 or by using a vacuum film forming method. The material of the gate insulation film 140 can be an organic film of, for example, PVP or an inorganic film of, for example, $SiO_2$. When the gate insulation film 140 is formed, in order to make the insulation property high, a material whose electric resistance is high and dielectric constant is stable must be applied with a thickness of some hundreds of nm. In a case where a part of the thickness is less than some hundreds of nm, a short circuit may be generated between the gate electrode 120 and the source electrode 150 (and/or the drain electrode 160), and when the thin film transistor array 100 is used in a displaying apparatus, this may cause major defects.

Next, the source electrodes 150 and the drain electrodes 160 are formed on the gate insulation film 140. The gate electrode 120 must be under a position where the branching section 150a of the source electrode 150 faces the drain electrode 160 at which position the channel region 170a is to be formed later. Therefore, alignment is performed at the position where the branching section 150a of the source electrode 150 faces the drain electrode 160 and the position of the gate electrode 120. However, the gate electrode 120 is linearly formed in the Y direction; therefore, a positional shift of the gate electrode 120 in the Y direction does not influence the characteristics of the thin film transistor array 100. That is, alignment accuracy only in the X direction must be considered.

Figure 15:
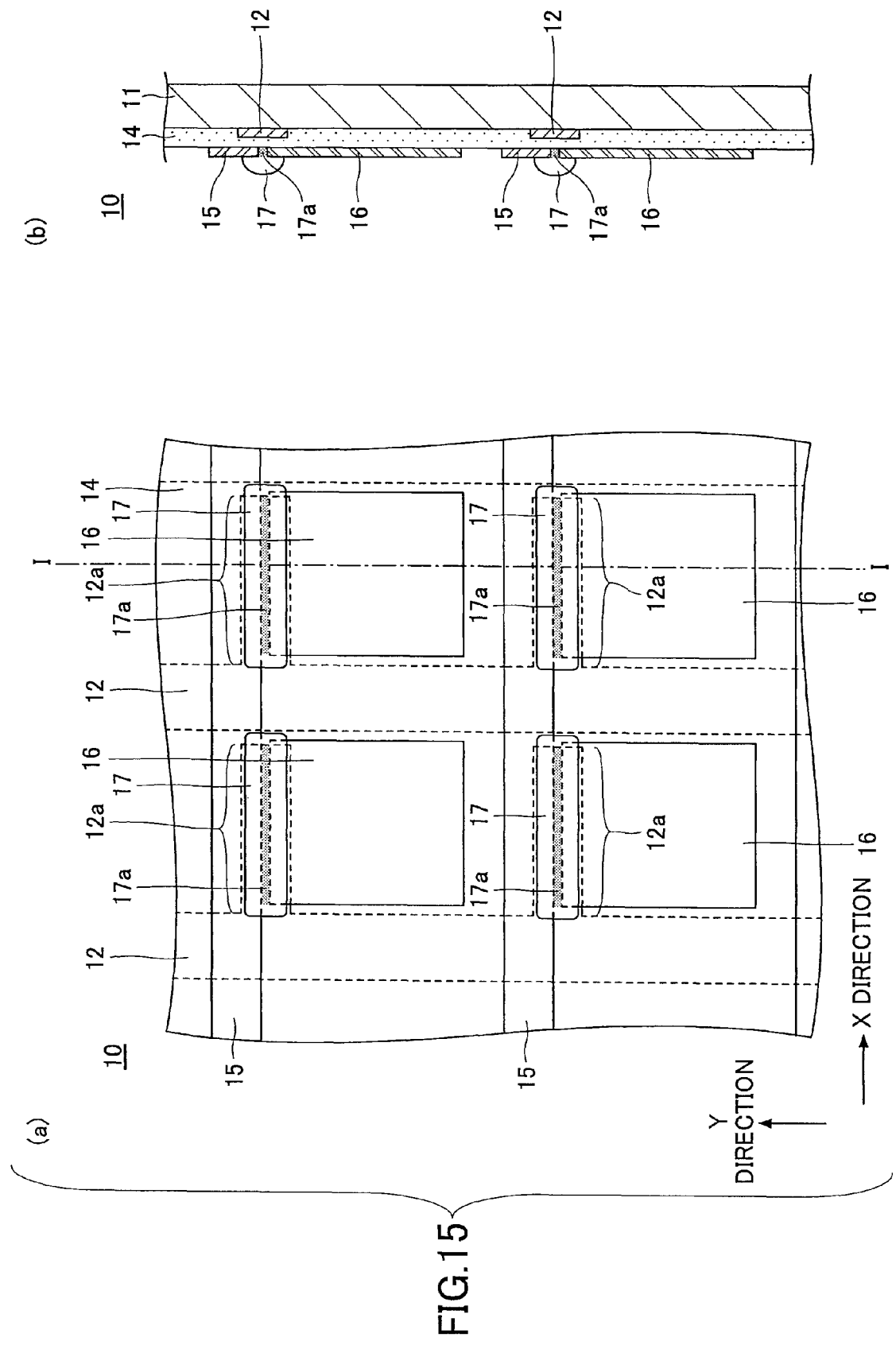
FIG. 15 is a structural diagram of a conventional thin film transistor array.

In the conventional thin film transistor array 10 shown in FIG. 15, the alignment accuracy in the X and Y directions must be considered. However, as described above, the thin film transistor array 100 of the present embodiment has a structure in which the alignment between the channel region 170a and the gate electrode 120 is easily performed.

Next, the semiconductor layer 170 is formed on the source electrode 150 and the drain electrode 160 for connecting the source electrode 150 and the drain electrode 160. When a voltage is applied to the gate electrode 120, the drain electrode 150 is electrically connected to the drain electrode 160 by electrons (holes) in the semiconductor layer 170. With this, the thin film transistor array 100 is formed.

When the drain electrode 160 of the thin film transistor array 100 shown in FIG. 1 is compared with the drain electrode 16 of the thin film transistor array 10 shown in FIG. 15, since the gate electrode 120 is linearly formed without having a branching section, the area of the drain electrode 160 is greater than the area of the drain electrode 16. In a case where the area of the drain electrode 160 is large, for example, when a through hole is formed in the drain electrode 160, alignment between the position of the drain electrode 160 and the position of the through hole can be easily performed.

As described above, according to the thin film transistor array 100 in the first embodiment of the present invention, since the gate electrode 120 is linearly formed without having a branching section, alignment between the gate electrode 120 and the channel region 170a formed between the source electrode 150 and the drain electrode 160 can be easily performed, and alignment between the drain electrode 160 and a through hole in the drain electrode 160 can be easily performed.

[Second Embodiment]

Figure 4:
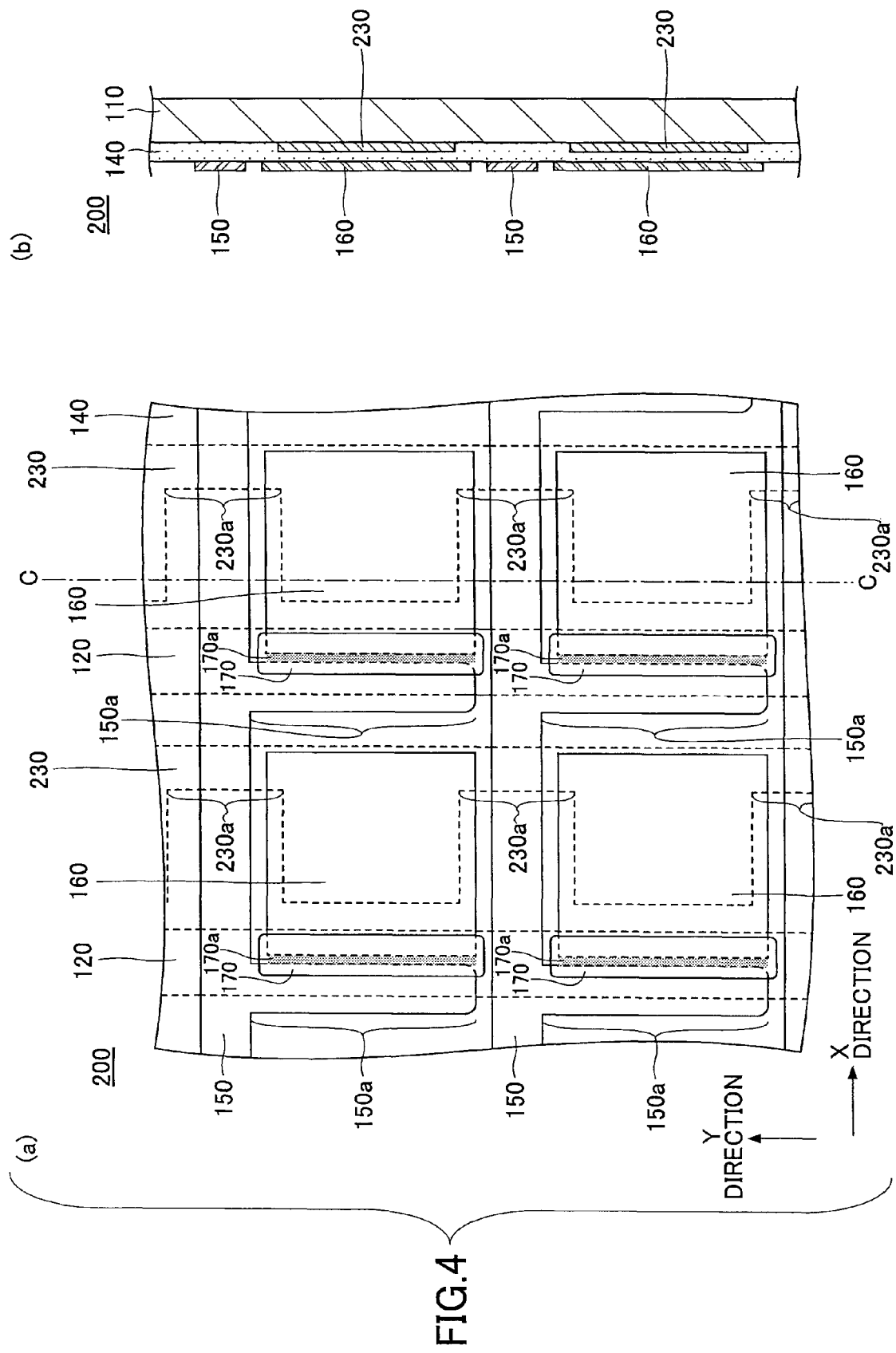
FIG. 4 is a structural diagram of a thin film transistor array according to a second embodiment of the present invention.

FIG. 4 is a structural diagram of a thin film transistor array 200 according to a second embodiment of the present invention. FIG. 4(a) is a plan view and FIG. 4(b) is a cross-sectional view along line C-C of FIG. 4(a). In FIG. 4, when an element is similar to or the same as that shown in FIG. 1, the same reference number as that shown in FIG. 1 is used for the element, and the same description as that in FIG. 1 is omitted.

The thin film transistor array 200 includes the insulation substrate 110, the gate electrodes 120, common electrodes 230, the gate insulation film 140, the source electrodes 150, the drain electrodes 160, the semiconductor layers 170, and the channel regions 170a. In addition, the source electrode 150 includes the branching section 150a, and the common electrode 230 includes incision parts 230a. In FIG. 4, the lengthwise direction of the source electrode 150 is in the X direction, and the lengthwise direction of the gate electrode 120 is in the Y direction. As described above, when the thin film transistor array 200 is compared with the thin film transistor array 100, the thin film transistor array 200 additionally includes the common electrodes 230. The manufacturing processes of the thin film transistor array 200 are almost similar to those of the thin film transistor array 100.

In the thin film transistor array 200, the plural gate electrodes 120 are formed by having an approximately constant interval among them on the insulation substrate 110. When the gate electrode 120 is compared with the gate electrode 12 shown in FIG. 15, the gate electrode 12 includes the branching section 12a; however, the gate electrode 120 does not include a branching section and is linearly formed. In addition, the common electrode 230 is formed between the two adjacent gate electrodes 120 approximately parallel to the gate electrodes 120.

Figure 5:
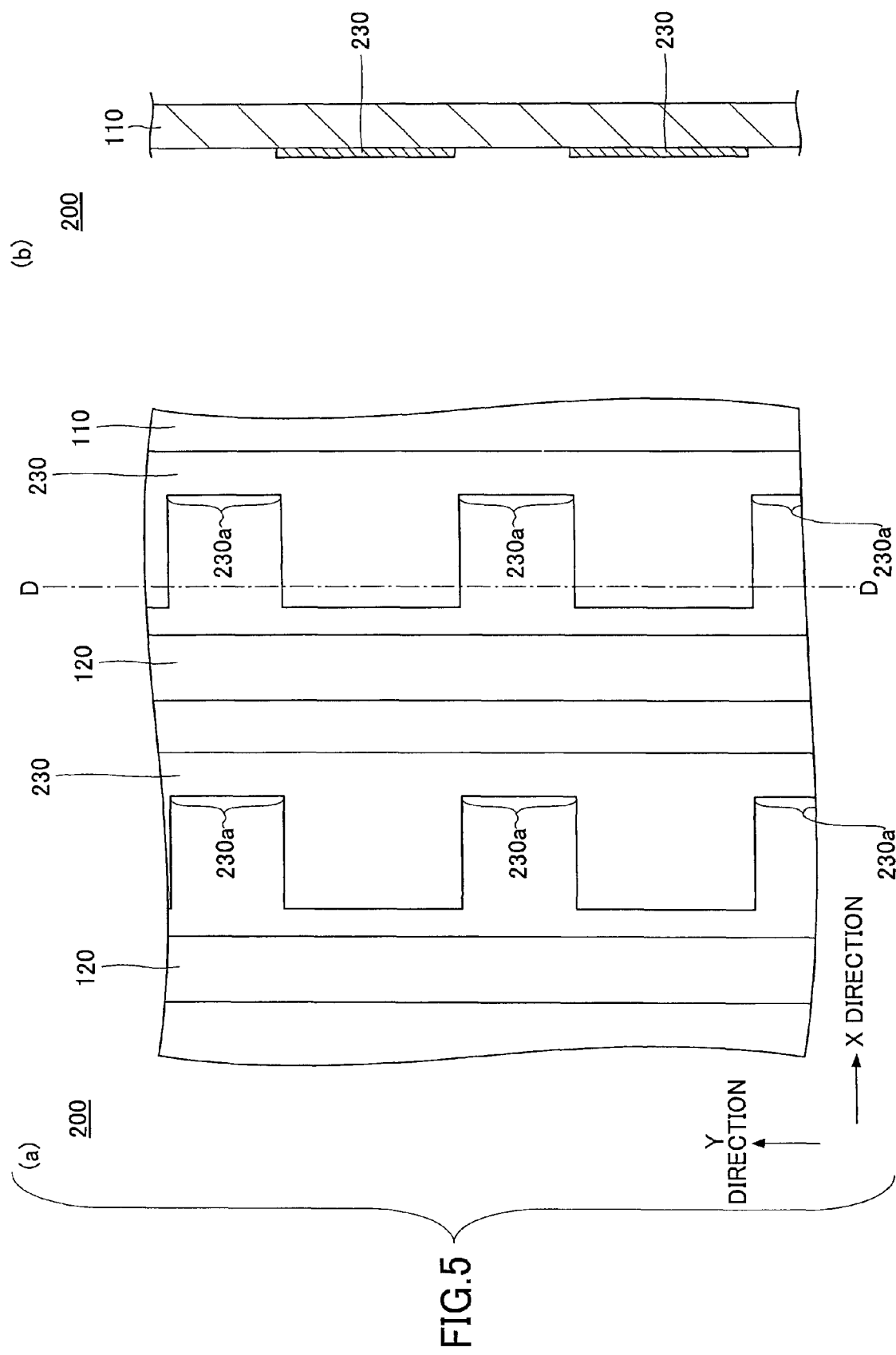
FIG. 5 is a structural diagram showing shapes of the gate electrodes and common electrodes in the thin film transistor array shown in FIG. 4.

FIG. 5 is a structural diagram showing shapes of the gate electrodes 120 and the common electrodes 230 in the thin film transistor array 200. FIG. 5(a) is a plan view and FIG. 5(b) is a cross-sectional view along line D-D of FIG. 5(a).

In FIG. 5, the gate electrodes 120 and the common electrodes 230 are formed on the insulation substrate 110. As described above, in the thin film transistor array 10 shown in FIG. 15, in a case where the gate electrode 12 includes the branching section 12a, when a common electrode is formed, a pattern must be formed between the gate electrode 12 and the branching section 12a. Therefore, the area of the branching section 12a must be small.

However, when the area of the branching section 12a is small, the width of the channel region 17a (channel width) becomes narrow and the amount of currents to be handled is decreased. When the area of the branching section 12a is made large so as to make the channel width wide, the distance between the gate electrode 12 and the branching section 12a becomes small, and the pattern must be formed by using a photolithography method to obtain an accurate pattern, and the manufacturing cost may be increased. When a printing method is used for forming the pattern, the manufacturing processes can be simplified and the cost can be low. However, the printing accuracy for forming a line space of 30 μm may not be realized by a printing method with which mass production is performed.

In the thin film transistor array 200 shown in FIG. 4, since the gate electrode 120 is linearly formed without having a branching section, the common electrode 230 can be easily formed. Since the distance between the gate electrodes 120 is generally 100 to 300 μm, the pattern can be formed by a printing method and the manufacturing cost of the thin film transistor array 200 can be lowered.

The common electrode 230 can be formed by the same process as that of the gate electrode 120, or can be formed by a process different from the process of the gate electrode 120. Since the common electrode 230 actively gives a capacitance component to the drain electrode 160, the common electrode 230 is formed at a position facing the drain electrode 160 via the gate insulation film 140 with almost the same area and shape as those of the drain electrode 160.

The capacitance is determined by an area where the common electrode 230 faces the drain electrode 160, and the thickness and the dielectric constant of the gate insulation film 140; therefore, the area of the common electrode 230 must be made similar in size to the area of the drain electrode 160 by as much as possible. However, since the common electrode 230 under the source electrode 150 works as floating capacitance when the source electrode 150 is driven, the area of the common electrode 230 under the source electrode 150 must be as small as possible. Therefore, as shown in FIG. 5, the incision part 230a is formed at the position where the common electrode 230 faces the source electrode 150 and the area of the common electrode 230 where the common electrode 230 faces the source electrode 250 is made small.

When the thin film transistor array 200 is used in a displaying apparatus, the plural gate electrodes 120 protrude in one direction from the thin film transistor array 200 and are connected to a gate driver IC for a scanning signal, and a selection signal is sequentially supplied to the gate electrode 120. In addition, the plural common electrodes 230 protrude in a direction opposite to the gate electrode protruding direction from the thin film transistor array 200, and a common voltage is applied to one unit of the common electrodes 230 by being integrated into the one unit.

The gate insulation film 140 is formed on the gate electrodes 120 and the common electrodes 230. The plural source electrodes 150 are formed by having an approximately constant interval among them on the gate insulation film 140, and the plural source electrodes 150 cross the plural gate electrodes 120 in the planar view. The source electrode 150 includes the branching section 150a which branches in an approximately perpendicular direction relative to the direction of the source electrode 150 so that the channel region 170a is formed. When the thin film transistor array 200 is used in a displaying apparatus, the plural source electrodes 150 protrude in one direction from the thin film transistor array 200 and are connected to a driver IC for a data signal, and the data signal is supplied to the source electrode 150.

The drain electrode 160 is formed at a position surrounded by the gate electrodes 120 and the source electrodes 150 in the planar view on the gate insulation film 140. When the thin film transistor array 200 is used in a displaying apparatus, the plural drain electrodes 160 become pixel electrodes. In addition, the semiconductor layer 170 is formed on the source electrode 150 and the drain electrode 160 approximately parallel to the branching section 150a of the source electrode 150. The semiconductor layers 170 are formed at corresponding separate positions so that a leakage current between the source electrodes 150 is prevented from being generated.

The channel region 170a is formed at a position where the branching section 150a of the source electrode 150 faces the drain electrode 160 under the semiconductor layer 170. The gate electrode 120 must be positioned under the channel region 170a so that an electric field is applied to the channel region 170a.

As described above, in the second embodiment of the present invention, the gate electrode 120 is linearly formed without having a branching section, the source electrode 150 includes the branching section 150a, the channel region 170a is formed at a position where the branching section 150a of the source electrode 150 faces the drain electrode 160 under the semiconductor layer 170, and the common electrode 230 is formed between the two adjacent gate electrodes 120 in parallel to the gate electrodes 120.

The gate insulation film 140 insulates the gate electrode 120 from the source electrode 150 and the drain electrode 160, and turns on/off the thin film transistor array 200 by applying an electric field applied to the gate electrode 120 to the channel region 170a formed between the source electrode 150 and the drain electrode 160.

As described above, according to the thin film transistor array 200 in the second embodiment of the present invention, since the gate electrode 120 is linearly formed without having a branching section, the common electrodes 230 can be formed without decreasing a current amount to be handled which decrease is caused by a narrow channel width. In addition, since the patterns of the common electrodes 230 can be formed by a printing method, the manufacturing cost of the thin film transistor array 200 can be reduced. In addition, similar to the first embodiment of the present invention, alignment between the gate electrode 120 and the channel region 170a formed between the source electrode 150 and the drain electrode 160 can be easily performed.

[Third Embodiment]

Figure 6:
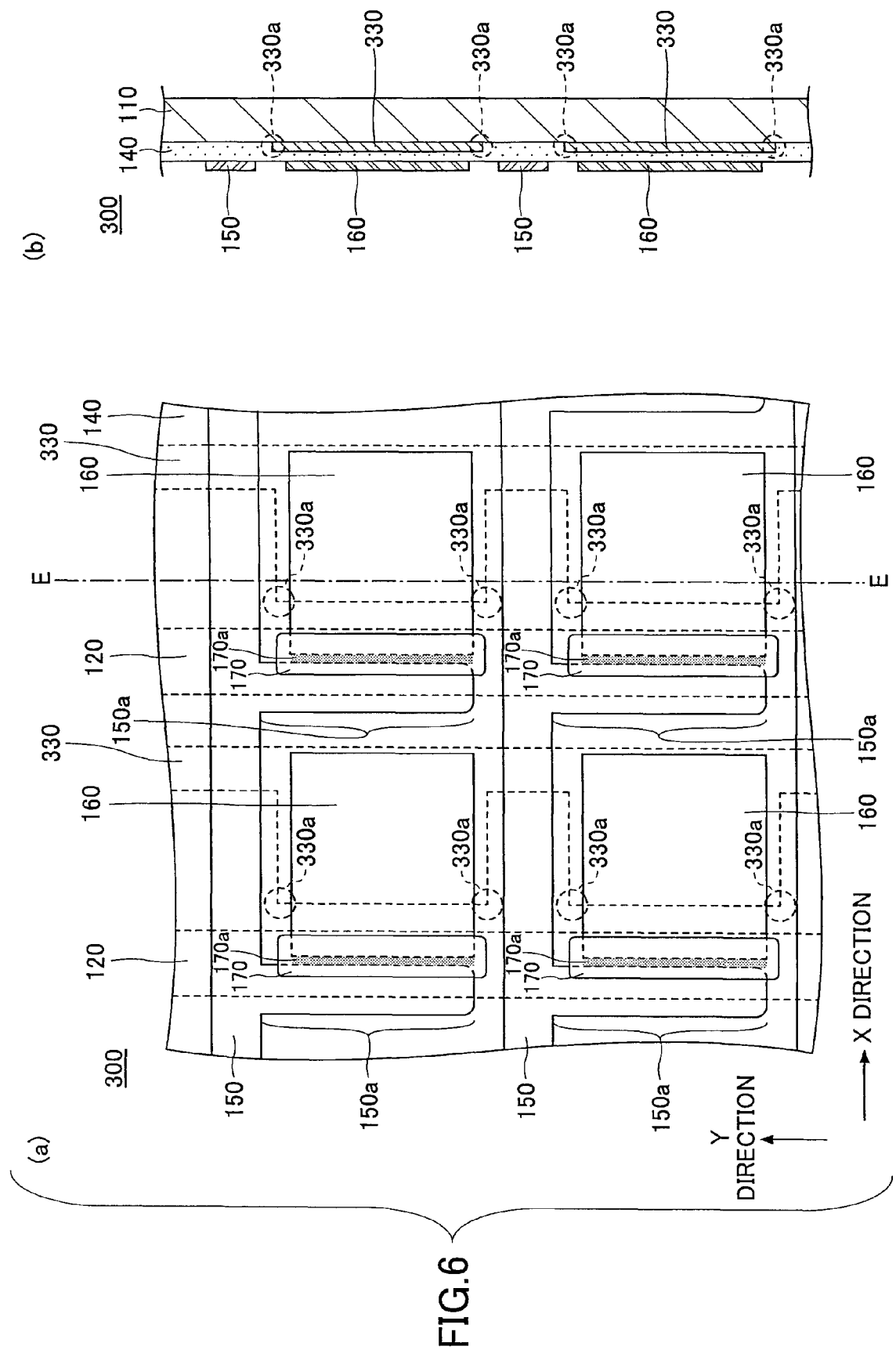
FIG. 6 is a structural diagram of a thin film transistor array according to a third embodiment of the present invention.

FIG. 6 is a structural diagram of a thin film transistor array 300 according to a third embodiment of the present invention. FIG. 6(*a*) is a plan view and FIG. 6(*b*) is a cross-sectional view along line E-E of FIG. 6(*a*). In FIG. 6, when an element is similar to or the same as that shown in FIG. 1, the same reference number as that shown in FIG. 1 is used for the element, and the same description as that in FIG. 1 is omitted.

The thin film transistor array 300 includes the insulation substrate 110, the gate electrodes 120, common electrodes 330, the gate insulation film 140, the source electrodes 150, the drain electrodes 160, the semiconductor layers 170, and the channel regions 170a. In addition, the source electrode 150 includes the branching section 150a, and the common electrode 330 includes corner parts 330a. In FIG. 6, the lengthwise direction of the source electrode 150 is in the X direction, and the lengthwise direction of the gate electrode 120 is in the Y direction. The shape of the corner part 330a includes a sharp shape, a rounded shape, and a chamfered shape.

When the thin film transistor array 300 is compared with the thin film transistor array 200, the thin film transistor array 300 includes the common electrodes 330 whose shape is different from that of the common electrode 230. As shown in FIG. 6, the corner parts 330a are formed at positions where the source electrodes 150 and the drain electrodes 160 do not exist in the planar view. The manufacturing processes of the thin film transistor 300 are almost similar to those of the thin film transistor 100.

In the thin film transistor array 300, the plural gate electrodes 120 are formed by having an approximately constant interval among them on the insulation substrate 110. When the gate electrode 120 is compared with the gate electrode 12 shown in FIG. 15, the gate electrode 12 includes the branching section 12a; however, the gate electrode 120 does not include a branching section and is linearly formed. In addition, the common electrode 330 is formed between the two adjacent gate electrodes 120 approximately parallel to the gate electrodes 120.

When the thin film transistor array 300 is used in a displaying apparatus, the plural gate electrodes 120 protrude in one direction from the thin film transistor array 300 and are connected to a gate driver IC for a scanning signal, and a selection signal is sequentially supplied to the gate electrode 120. In addition, the plural common electrodes 330 protrude in a direction opposite to the gate electrode protruding direction from the thin film transistor array 300, and a common voltage is applied to one unit of the common electrodes 330 by being integrated into the one unit.

The gate insulation film 140 is formed on the gate electrodes 120 and the common electrodes 330. The plural source electrodes 150 are formed by having an approximately constant interval among them on the gate insulation film 140, and the plural source electrodes 150 cross the plural gate electrodes 120 in the planar view. The source electrode 150 includes the branching section 150a which branches in an approximately perpendicular direction relative to the direction of the source electrode 150 so that the channel region 170a is formed. When the thin film transistor array 300 is used in a displaying apparatus, the plural source electrodes 150 protrude in one direction from the thin film transistor array 300 and are connected to a driver IC for a data signal, and the data signal is supplied to the source electrode 150.

The drain electrode 160 is formed at a position surrounded by the gate electrodes 120 and the source electrodes 150 in the planar view on the gate insulation film 140. When the thin film transistor array 300 is used in a displaying apparatus, the plural drain electrodes 160 become pixel electrodes. In addition, the semiconductor layer 170 is formed on the source electrode 150 and the drain electrode 160 approximately parallel to the branching section 150a of the source electrode 150. The semiconductor layers 170 are formed at corresponding separate positions so that a leakage current between the source electrodes 150 is prevented from being generated.

The channel region 170a is formed at a position where the branching section 150a of the source electrode 150 faces the drain electrode 160 under the semiconductor layer 170. The gate electrode 120 must be positioned under the channel region 170a so that an electric field is applied to the channel region 170a.

Figure 16:
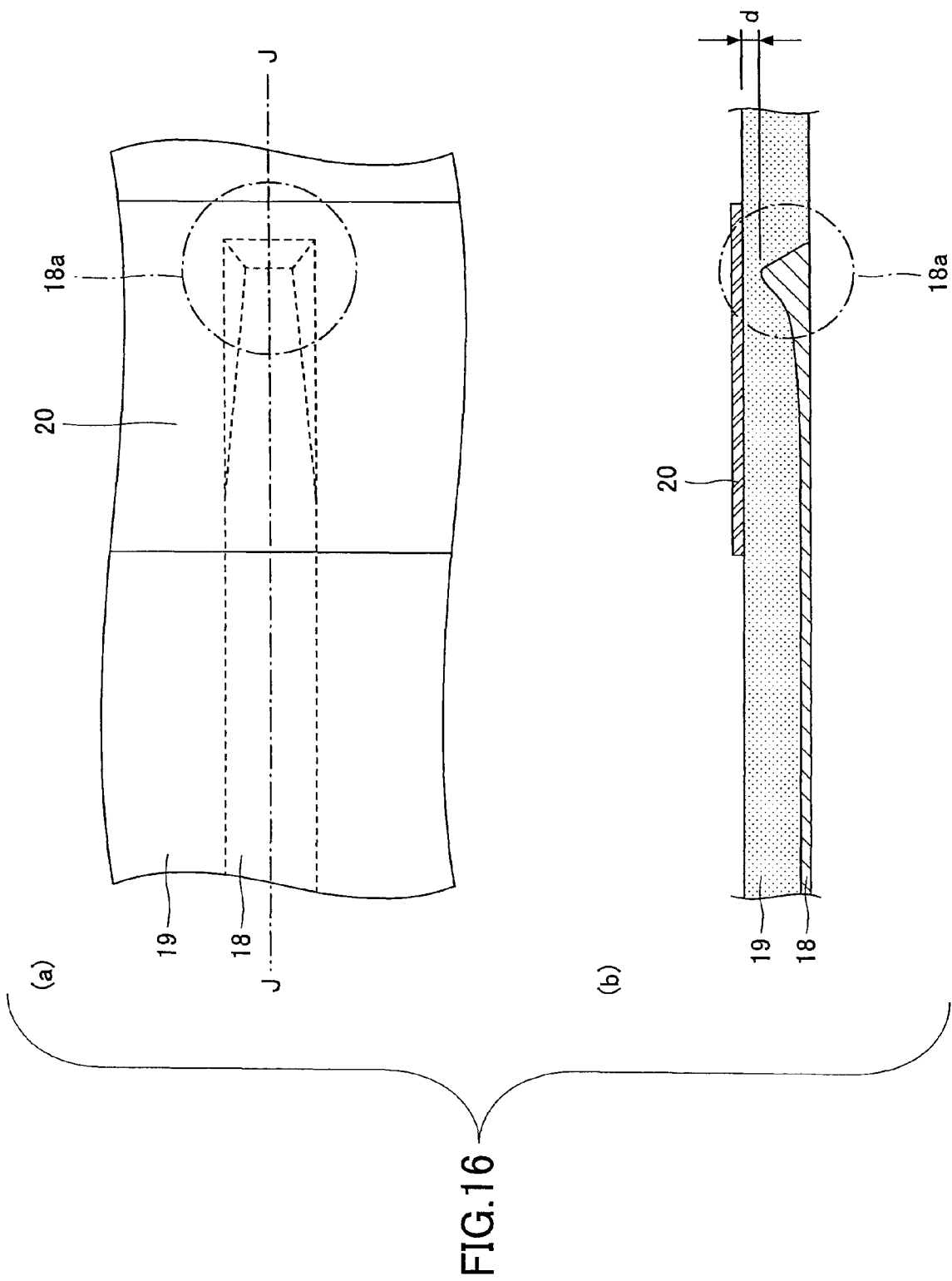
FIG. 16 is a diagram showing a general-purpose lower electrode formed by a pattern using a printing method.

Next, a corner part is generally described. FIG. 16 is a diagram showing a general-purpose lower electrode 18 formed by a pattern using a printing method. FIG. 16(*a*) is a plan view and FIG. 16(*b*) is a cross-sectional view along line J-J of FIG. 16(*a*). In FIG. 16, the lower electrode 18, a corner part 18a of the lower electrode 18, an insulation film 19, an upper electrode 20 are shown. In addition, "d" is a minimum thickness of the insulation film 19 between the lower electrode 18 and the upper electrode 20. The lower electrode 18 and the upper electrode 20 are formed by sandwiching the insulation film 19 between them. The corner part 18a has a convex shape.

Figure 17:
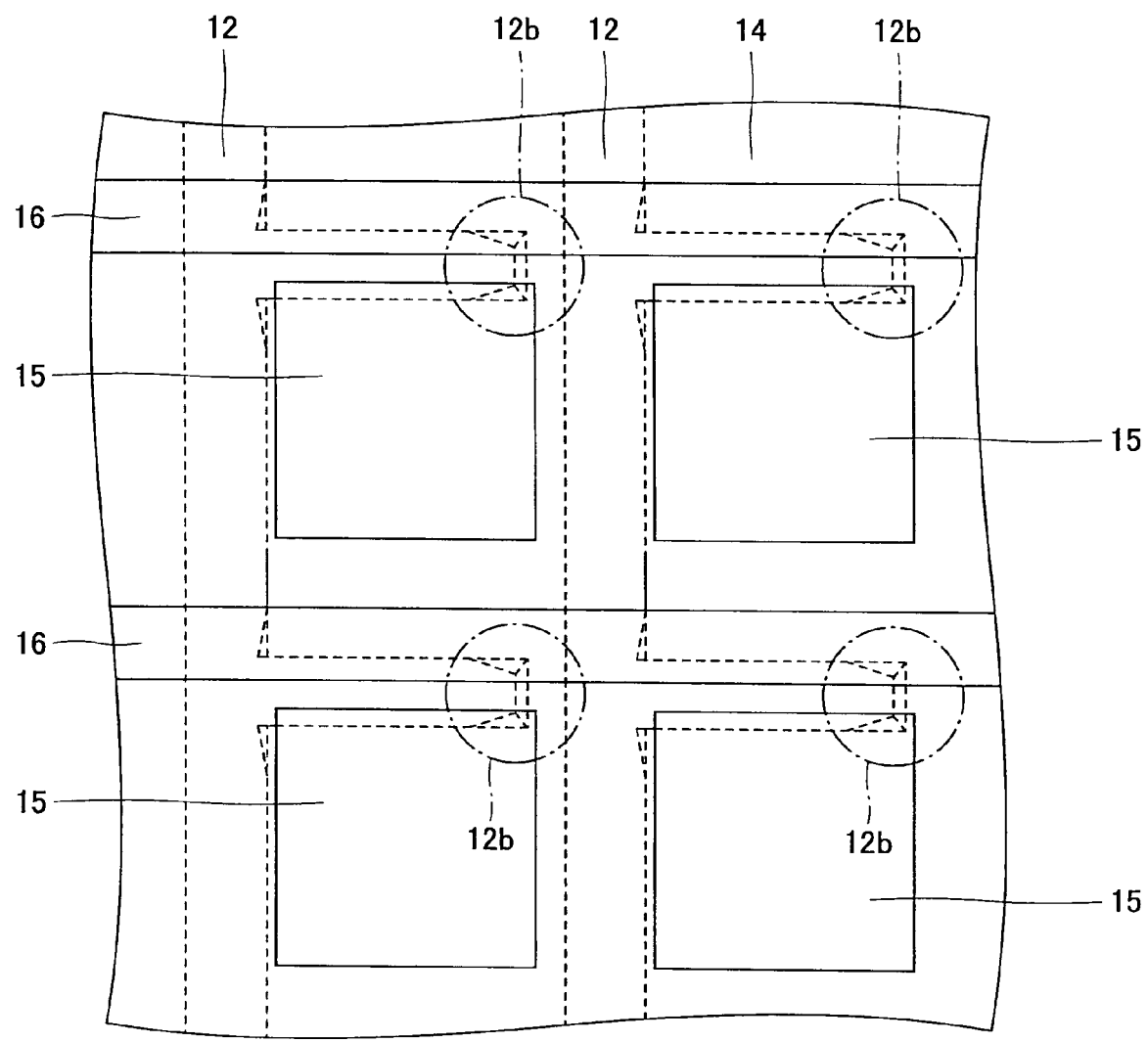
FIG. 17 is a diagram showing a shape of a gate electrode shown in FIG. 15.

FIG. 17 is a diagram showing a shape of the gate electrode 12 shown in FIG. 15. In FIG. 17, the gate electrode 12 indicates a lower electrode, and the gate electrode 12 includes a corner part 12b. That is, the gate electrode 12 corresponds to the lower electrode 18 shown in FIG. 16 and the corner part 12b of the gate electrode 12 corresponds to the corner part 18a of the lower electrode 18. In other words, the corner part 12b of the gate electrode 12 has a convex shape.

In a pattern forming by a printing method, a process to dry a solvent must be included. The vapor pressure of the solvent at the drying process is hardly maintained in a uniform manner due to asymmetry of the pattern. When the lower electrode 18 is formed by a pattern with use of a printing method, as shown in FIG. 16(b), the cross sectional shape of the lower electrode 18 becomes non-uniform. It is assumed that the non-uniformity is caused by a so-called coffee stain phenomenon. In the coffee stain phenomenon, the drying states become non-uniform due to differences of the vapor pressure, whereby a solid substance is adhered onto a dried part. Since the vapor pressure cannot be sufficiently controlled, some degrees of the non-uniformity must be accepted.

As shown in FIG. 17, the corner part 12b of the gate electrode 12 at the ending position of the gate electrode in the outside direction may become a convex part in its cross section, and a corner part at the starting point of the protruded part of the gate electrode 12 may become a concave part in its cross section. Therefore, the corner part 12b of the gate electrode 12 must be carefully studied.

The convex part in the cross sectional shape caused by the coffee stain phenomenon likely concentrates on a corner part of a wiring pattern where the dispersion of the vapor pressure becomes great; that is, concentrates on the corner part 12b of the gate electrode 12. The convex part is formed in a range of approximately 10 µm from an intersection point (peak) of two sides of the corner part in the planar view. When a convex part is formed in a corner part, as shown in FIG. 16(b), the thickness of the insulation film 19 (the gate insulation film 14) between the lower electrode 18 (the gate electrode 12) and the upper electrode 20 (the source electrode 15 and the drain electrode 16) cannot be a predetermined thickness, and a short circuit or poor insulation may occur between the lower electrode 18 and the upper electrode 20.

In addition, in order to apply a strong electric field to the channel region 170a from the gate electrode 12, the thickness of the gate insulation film 14 is likely to be as thin as possible. This may cause a short circuit or poor insulation. Therefore, when a pattern of the lower electrode 18 is formed by a printing method, it is preferable that the corner part 18a be not formed in the lower electrode 18.

In the thin film transistor array 300 according to the third embodiment of the present invention, since the gate electrode 120 is linearly formed without having a branching section, the gate electrode 120 does not include a corner part; that is, does not include a convex part of the corner part. Therefore, the gate electrode 120 can be easily formed by a printing method.

However, as described in FIGS. 4 and 5 of the thin film transistor array 200 according to the second embodiment of the present invention, in order to obtain sufficient capacitance, the area of the common electrode 230 is preferably as large as possible. However, since a part of the common electrode 230 under the source electrode 150 works as floating capacitance when the source electrode 150 is driven, the area of the part must be as small as possible. Therefore, as shown in FIGS. 4 and 5, the common electrode 230 includes the incision part 230a so that the area of the common electrode 230 under the source electrode 150 is as small as possible. When the common electrode 230 includes the incision part 230a, the common electrode 230 inevitably includes corner parts of the incision part 230a. Similarly, as shown in FIG. 6, in the thin film transistor array 300 according to the third embodiment of the present invention, the common electrode 330 includes the corner part 330a.

In the thin film transistor array 300 shown in FIG. 6, the gate electrode 120 is linearly formed without having a branching section; therefore, a corner part is not formed in the gate electrode 120. Accordingly, the gate electrode 120 does not include an unnecessary convex part, and when the gate electrode 120 is formed by a printing method, the above described poor insulation may not occur. However, as described above, the common electrode 330 inevitably includes the corner part 330a, and when the common electrode 330 is formed by a printing method, a convex part is formed in the corner part 330a. Consequently, when the source electrode 150 and the drain electrode 160 positioned above the common electrode 330 are formed at positions above the corner parts 330a of the common electrode 330 in the planar view, poor insulation between the common electrode 330 and source electrode 150 (and/or the drain electrode 160) may occur.

In order to solve the above problem, in the thin film transistor array 300, the corner part 330a of the common electrode 330 is formed at a position where the corner part 330a does not overlap the source electrode 150 and the drain electrode 160 in the planar view. As described above, since the convex part is formed in a range of approximately 10 µm from an intersection point (peak) of two sides of the corner part in the planar view, the distance between the source electrode 150 and the drain electrode 160 at a position where the corner part 330a of the common electrode 330 is disposed must be, for example, some tens of µm by considering an alignment error or shift. With this, a risk for generating the poor insulation can be decreased.

In order to evaluate the effect of the thin film transistor array 300, two samples were formed. In a first sample, the corner part 330a of the common electrode 330 was formed at a position where the corner part 330a does not overlap the source electrode 150 and the drain electrode 160 (upper electrodes) in the planar view by a printing method. In a second sample, the corner part 330a of the common electrode 330 was formed at a position where the corner part 330a overlaps the source electrode 150 and the drain electrode 160 (upper electrodes) in the planar view by a printing method. Then, a dielectric strength test was applied to the two samples. In this case, the first sample is the third embodiment of the present invention.

Figure 7:
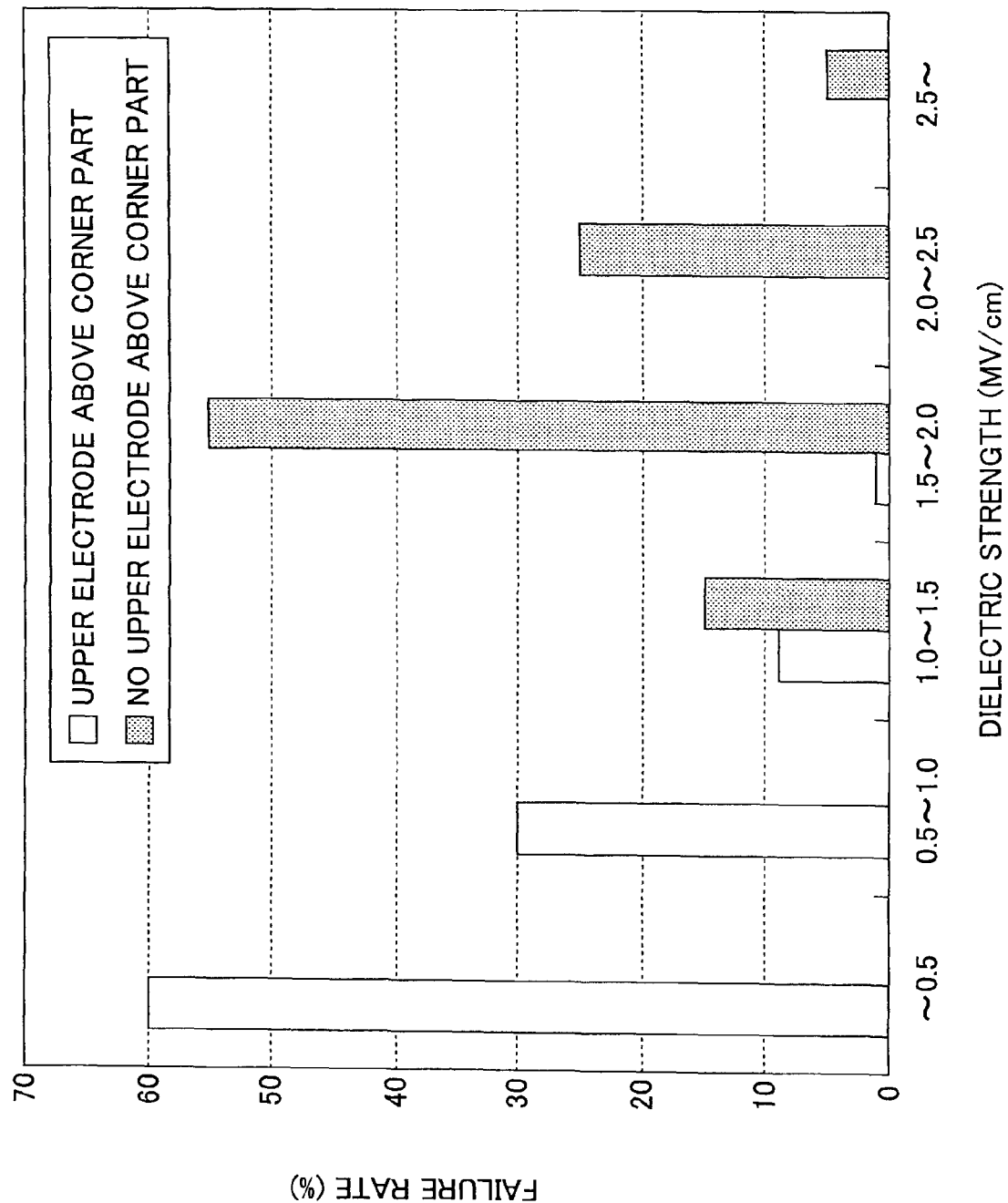
FIG. 7 is a graph showing the results of a dielectric strength test according to the third embodiment of the present invention.

FIG. 7 is a graph showing the results of the dielectric strength test. In FIG. 7, a relationship between the dielectric strength and the failure rate is shown. As shown in FIG. 7, the dielectric strength of the first sample is greater than that of the second sample. As shown in FIG. 7, the failure rate of the second sample in which the upper electrodes exist above the corner part is high at a low dielectric strength, and the failure rate of the first sample in which the upper electrodes do not exist above the corner part is low at the low dielectric strength.

As described above, in the third embodiment of the present invention, since the corner part 330a of the common electrode 330 is formed at a position where the corner part 330a does not overlap the source electrode 150 and the drain electrode 160 in the planar view, the dielectric strength between the common electrode 330 and the source electrode 150 (and/or the drain electrode 160) can be increased, and a leakage current can be prevented from being generated. In addition, since the patterns of the common electrodes 330 can be formed by a printing method, the manufacturing cost of the thin film transistor array 300 can be reduced. In addition, similar to the first embodiment of the present invention, alignment between the gate electrode 120 and the channel region 170a formed between the source electrode 150 and the drain electrode 160 can be easily performed.

[Fourth Embodiment]

Figure 8:
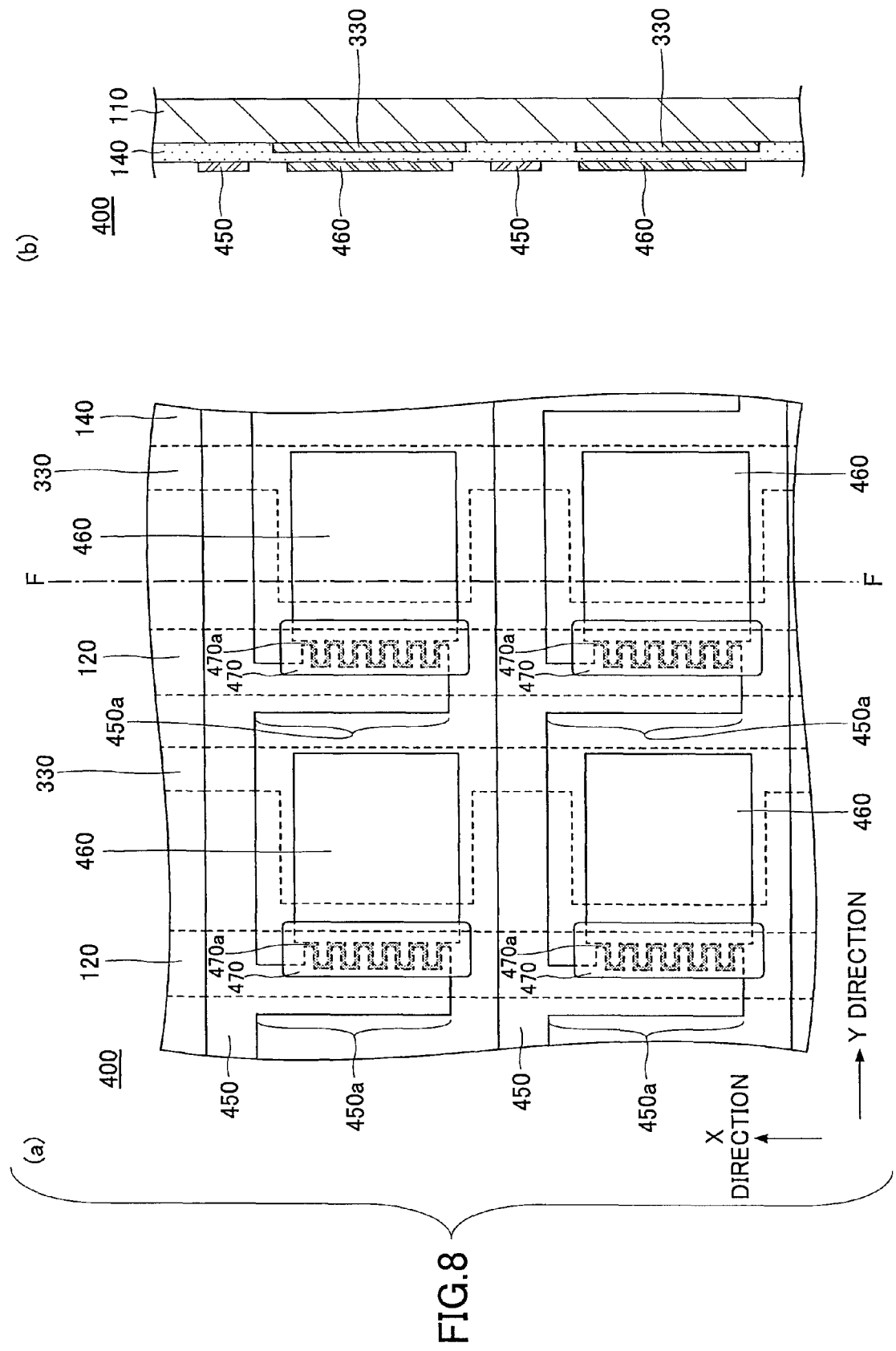
FIG. 8 is a structural diagram of a thin film transistor array according to a fourth embodiment of the present invention.

FIG. 8 is a structural diagram of a thin film transistor array 400 according to a fourth embodiment of the present invention. FIG. 8(a) is a plan view and FIG. 8(b) is a cross-sectional view along line F-F of FIG. 8(a). In FIG. 8, when an element is similar to or the same as that shown in FIG. 1, the same reference number as that shown in FIG. 1 through FIG. 7 is used for the element, and the same description as that in FIG. 1 through FIG. 7 is omitted.

The thin film transistor array 400 includes the insulation substrate 110, the gate electrodes 120, the common electrodes 330, the gate insulation film 140, source electrodes 450, drain electrodes 460, semiconductor layers 470, and channel regions 470a. In FIG. 8, the lengthwise direction of the source electrode 450 is in the Y direction, and the lengthwise direction of the gate electrode 120 is in the X direction. When the thin film transistor array 400 is compared with the thin film transistor arrays 100, 200, and 300, the shapes of the source electrode 450, the drain electrode 460, the semiconductor layer 470, and the channel region 470a are different from the shapes of the source electrode 150, the drain electrode 160, the semiconductor layer 170, and the channel region 170a. The manufacturing processes of the thin film transistor 400 are almost similar to those of the thin film transistor 100.

In the thin film transistor array 400, the plural gate electrodes 120 are formed by having an approximately constant interval among them on the insulation substrate 110. When the gate electrode 120 is compared with the gate electrode 12 shown in FIG. 15, the gate electrode 12 includes the branching section 12a; however, the gate electrode 120 does not include a branching section and is linearly formed. In addition, the common electrode 330 is formed between the two adjacent gate electrodes 120 approximately parallel to the gate electrodes 120.

When the thin film transistor array 400 is used in a displaying apparatus, the plural gate electrodes 120 protrude in one direction from the thin film transistor array 400 and are connected to a gate driver IC for a scanning signal, and a selection signal is sequentially supplied to the gate electrode 120. In addition, the plural common electrodes 330 protrude in a direction opposite to the gate electrode protruding direction from the thin film transistor array 400, and a common voltage is applied to one unit of the common electrodes 330 by being integrated into the one unit.

The gate insulation film 140 is formed on the gate electrodes 120 and the common electrodes 330. The plural source electrodes 450 are formed by having an approximately constant interval among them on the gate insulation film 140, and the plural source electrodes 450 cross the plural gate electrodes 120 in the planar view. The source electrode 450 includes the branching section 450a which branches in an approximately perpendicular direction relative to the direction of the source electrode 450 so that the channel region 470a is formed. When the thin film transistor array 400 is used in a displaying apparatus, the plural source electrodes 450 protrude in one direction from the thin film transistor array 400 and are connected to a driver IC for a data signal, and the data signal is supplied to the source electrode 450.

The drain electrode 460 is formed at a position surrounded by the gate electrodes 120 and the source electrodes 450 in the planar view on the gate insulation film 140. When the thin film transistor array 400 is used in a displaying apparatus, the plural drain electrodes 460 become pixel electrodes. In addition, the semiconductor layer 470 is formed on the source electrode 450 and the drain electrode 460 approximately parallel to the branching section 450a of the source electrode 450. The semiconductor layers 470 are formed at corresponding separate positions so that a leakage current between the source electrodes 450 is prevented from being generated.

The channel region 470a is formed at a position where the branching section 450a of the source electrode 450 faces the drain electrode 460 under the semiconductor layer 470. The gate electrode 120 must be positioned under the channel region 470a so that an electric field is applied to the channel region 470a.

In the thin film transistor array 400, in order to increase a current amount to flow into the thin film transistor array 400, a comb-shaped pattern is formed in the source electrode 450 and the drain electrode 460 at positions where the source electrode 450 face the drain electrode 460. In the comb-shaped pattern, concave parts and convex parts are alternately formed. The concave parts and the convex parts of the comb-shaped patterns of the source electrode 450 and the drain electrode 460 are engaged with each other, and the channel region 470a is formed. The comb-shaped pattern of the source electrode 450 is formed in the branching section 450a of the source electrode 450 and unnecessary convex and concave parts are not formed in the source electrode 450 other than the branching section 450a. Therefore, unnecessary current concentrating positions are not formed and the area of the drain electrode 460 is not needed to be small.

In order to increase the current amount flowing into the thin film transistor array 400, the comb-shaped pattern is formed. The shape of the comb-shaped pattern is not limited to the above, and can be a triangle, a trapezoid, or another shape when the shapes can be engaged with each other.

As described above, in the thin film transistor array 400 of the fourth embodiment of the present invention, since the comb-shaped pattern is formed in the source electrode 450 and the drain electrode 460 at the positions where the source electrode 450 faces the drain electrode 460, the convex parts and the concave parts of the comb-shaped patters are engaged with each other. With this, an effective channel width of the channel region 470a can be increased, and the current amount flowing into the thin film transistor array 400 can be increased. In addition, since the patterns of the common electrodes 330 can be formed by a printing method, the manufacturing cost of the thin film transistor array 400 can be reduced. In addition, similar to the first embodiment of the present invention, alignment between the gate electrode 120 and the channel region 470a formed between the source electrode 450 and the drain electrode 460 can be easily performed.

[Fifth Embodiment]

Figure 9:
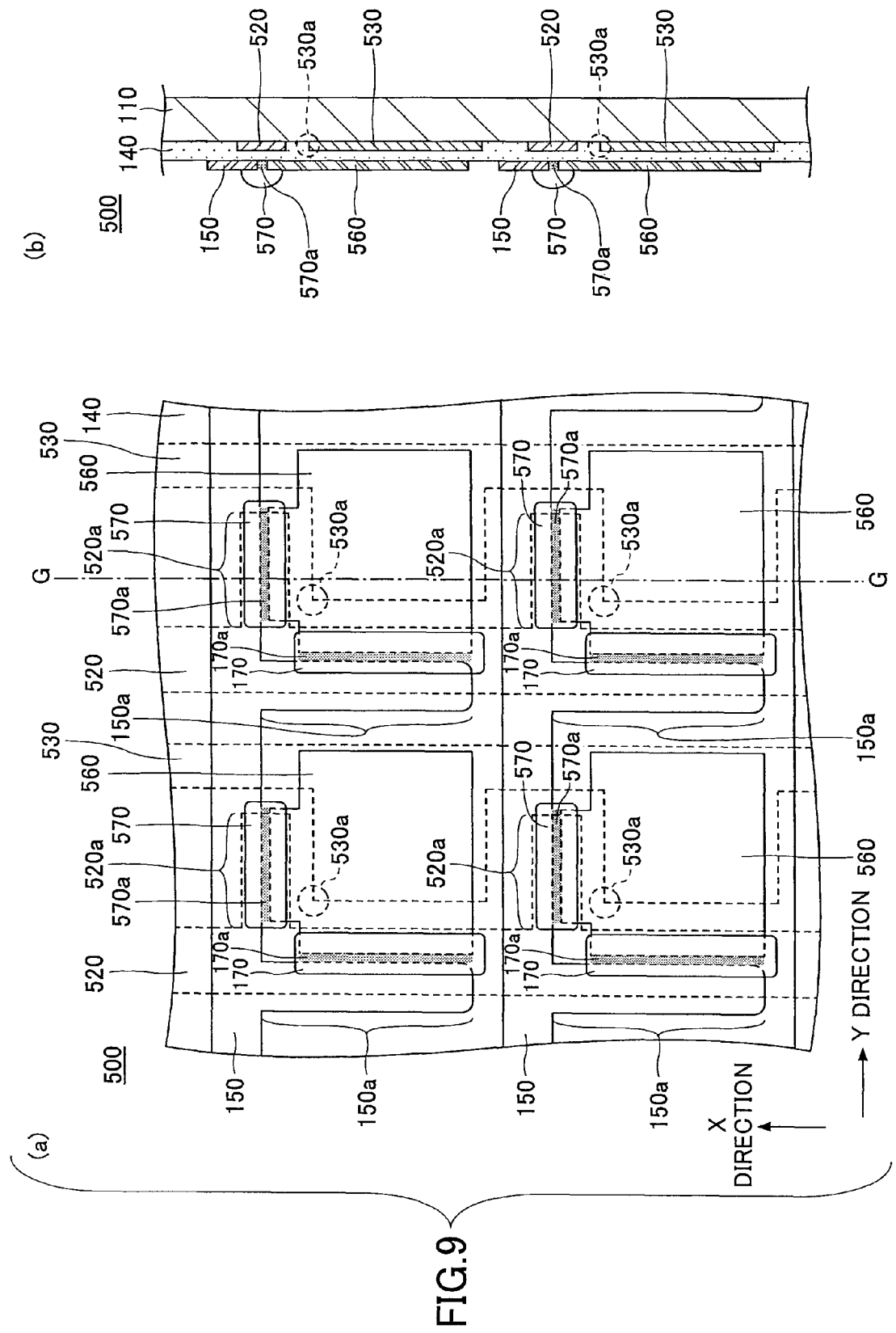
FIG. 9 is a structural diagram of a thin film transistor array according to a fifth embodiment of the present invention.

FIG. 9 is a structural diagram of a thin film transistor array 500 according to a fifth embodiment of the present invention. FIG. 9(*a*) is a plan view and FIG. 9(*b*) is a cross-sectional view along line G-G of FIG. 9(*a*). In FIG. 9, when an element is similar to or the same as that shown in FIG. 1 through FIG. 8, the same reference number as that shown in FIG. 1 through FIG. 8 is used for the element, and the same description as that in FIG. 1 through FIG. 8 is omitted.

The thin film transistor array 500 includes the insulation substrate 110, gate electrodes 520, common electrodes 530, the gate insulation film 140, the source electrodes 150, drain electrodes 560, first semiconductor layers 170, second semiconductor layers 570, first channel regions 170a, and second channel regions 570a. In FIG. 9, the lengthwise direction of the source electrode 150 is in the Y direction, and the lengthwise direction of the gate electrode 520 is in the X direction. In addition, the source electrode 150 includes the branching section 150a, the gate electrode 520 includes a branching section 520a, and the common electrode 530 includes corner parts 530a.

When the thin film transistor array 500 is compared with the thin film transistor arrays 100 through 400, in the thin film transistor array 500, the source electrode 150 is connected to the drain electrode 560 by the second semiconductor layer 570, and the second channel region 570a is formed between the source electrode 150 and the drain electrode 560. In addition, since the second channel region 570a is provided, the shape of the gate electrode 520 is different from that of the gate electrode 120, and the gate electrode 520 includes the branching section 520a. Further, the shape of the drain electrode 560 is different from those of the drain electrode 160 and the drain electrode 460 so as to form the second channel region 570a. The manufacturing processes of the thin film transistor 500 are almost similar to those of the thin film transistor 100.

In the thin film transistor array 500, the plural gate electrodes 520 are formed by having an approximately constant interval among them on the insulation substrate 110. As described above, the gate electrode 520 includes the branching section 520a. In addition, the common electrode 530 is formed between the two adjacent gate electrodes 520 approximately parallel to the gate electrodes 520.

When the thin film transistor array 500 is used in a displaying apparatus, the plural gate electrodes 520 protrude in one direction from the thin film transistor array 500 and are connected to a gate driver IC for a scanning signal, and a selection signal is sequentially supplied to the gate electrode 520. In addition, the plural common electrodes 530 protrude in a direction opposite to the gate electrode protruding direction from the thin film transistor array 500, and a common voltage is applied to one unit of the common electrodes 530 by being integrated into the one unit.

Figure 10:
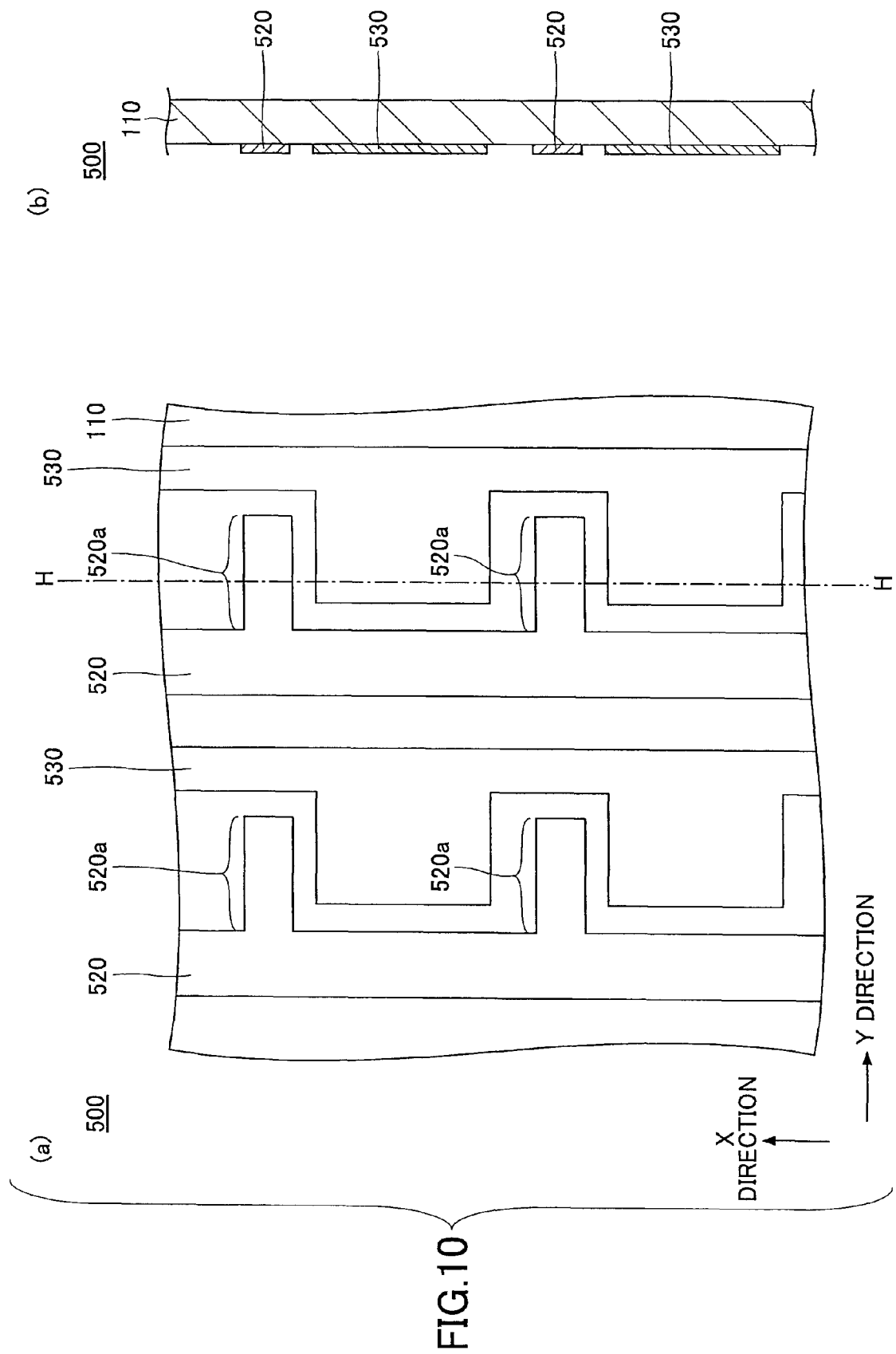
FIG. 10 is a schematic diagram showing shapes of the gate electrodes and the common electrodes according to the fifth embodiment of the present invention.

Referring to FIG. 10, the gate electrodes 520 and the common electrodes 530 are described in detail. FIG. 10 is a schematic diagram showing shapes of the gate electrodes 520 and the common electrodes 530. FIG. 10(a) is a plan view and FIG. 10(b) is a cross-sectional view along line H-H of FIG. 10(a).

In FIGS. 9 and 10, the gate electrodes 520 and the common electrodes 530 are formed on the insulation substrate 110. The branching section 520a of the gate electrode 520 is formed at a position where the branching section 520a faces the second channel region 570a. In order to form the common electrode 530, since a pattern must be formed between the gate electrode 520 and the branching section 520a, the area of the branching section 520a must be adjusted. The corner part 530a of the common electrode 530 is at a position where the corner part 530a overlaps the drain electrode 560 in the planar view. Consequently, poor insulation may occur; therefore, the common electrode 530 is preferably formed by a photolithography method.

The gate insulation film 140 is formed on the gate electrodes 520 and the common electrodes 530. The plural source electrodes 150 are formed by having an approximately constant interval among them on the gate insulation film 140, and the plural source electrodes 150 cross the plural gate electrodes 520 in the planar view. The source electrode 150 includes the branching section 150a which branches in an approximately perpendicular direction relative to the direction of the source electrode 450 so that the first channel region 170a is formed. When the thin film transistor array 500 is used in a displaying apparatus, the plural source electrodes 150 protrude in one direction from the thin film transistor array 500 and are connected to a driver IC for a data signal, and the data signal is supplied to the source electrode 150.

The drain electrode 560 is formed at a position surrounded by the gate electrodes 520 and the source electrodes 150 in the planar view on the gate insulation film 140. When the thin film transistor array 500 is used in a displaying apparatus, the plural drain electrodes 560 become pixel electrodes. In addition, the first semiconductor layer 170 is formed approximately parallel to the branching section 150a of the source electrode 150 and the second semiconductor layer 570 is formed approximately parallel to the source electrode 150 on the source electrode 150 and the drain electrode 560. The first semiconductor layers 170 are formed at corresponding separate positions and the second semiconductor layer 570 are formed at corresponding separate positions so that a leakage current between the source electrodes 150 is prevented from being generated.

The channel region 570a is formed at a position where the source electrode 150 faces the drain electrode 560 under the second semiconductor layer 570. The gate electrode 520 must be positioned under the first channel region 170a and the second channel region 570a so that an electric field is applied to the first channel region 170a and the second channel region 570a.

The thin film transistor array 500 includes the two channel regions (the first channel region 170a and the second channel region 570a), when the source electrode 150 is formed by a printing method, a short circuit may be generated between the source electrode 150 and the drain electrode 560 at a position where the two channel regions approach. That is, the position is where a side of the drain electrode 560 contacting the first channel region 170a crosses a side of the drain electrode 560 contacting the second channel region 570a in the planar view.

FIG. 11 is a schematic diagram showing corner parts of a pattern formed by a printing method. Generally, a right angle part (to be formed as an approximately right angle part) of a pattern formed by a printing method is not formed as a right angle due to surface tension of a liquid soon after the printing and is formed as a rounded shape. FIG. 11(a) shows a case in which a corner part 150b of the source electrode 150 is formed as a rounded shape due to the surface tension of the liquid soon after the printing. When the corner part 150b of the source electrode 150 is formed as a rounded shape, a distance "d" between the source electrode 150 and the drain electrode 560 becomes extremely short (that is, a channel length of this part becomes extremely short), and at worst, a short circuit may be generated between the source electrode 150 and the drain electrode 560. In order to solve the above problem, as shown in FIG. 11(b), a pattern unformed region 560a is formed with an area whose size is greater than the channel width of the first channel region 170a and the channel width of the second channel region 570a at a part of the drain electrode 560 at which part the short circuit may be generated between the source electrode 150 and the drain electrode 560. When the pattern unformed region 560a is formed, the short circuit between the source electrode 150 and the drain electrode 560 can be prevented. The pattern unformed region 560a can be formed in the thin film transistor arrays 100 through 400.

As described above, in the thin film transistor array 500 of the fifth embodiment of the present invention, the gate electrode 520 includes the branching section 520a, and the thin film transistor array 500 provides the second channel region 570a, in addition to the first channel region 170a. Therefore, the effective channel width can be widened and a current amount flowing into the thin film transistor array 500 can be increased.

In addition, when the fourth embodiment of the present invention is applied to the fifth embodiment, the comb-shaped pattern can be formed in the source electrode 150 and the drain electrode 560 at parts where the first channel region 170a (and/or the second channel region 570a) is formed, and the comb-shaped pattern of the source electrode 150 is engaged with the comb-shaped pattern of the drain electrode 560. With this, the effective channel width can be further widened and a current amount flowing into the thin film transistor array 500 can be further increased. In addition, since the pattern unformed region 560a is formed at a part of the drain electrode 560, a short circuit between the source electrode 150 and the drain electrode 560 can be prevented from been generated.

The thin film transistor array 500 can obtain effects similar to the effects in the thin film transistor arrays 100 through 400. In the thin film transistor array 500, the branching section 520a which branches in the Y direction is provided in the gate electrode 520. Therefore, when the alignment in the Y direction is shifted, the shift does not influence the first channel region 170a; however, the shift influences the second channel region 570a. However, the area of the first channel region 170a is greater than the area of the second channel region 570a, and the first channel region 170a contributes to the characteristics of the thin film transistor array 500 greater than the second channel region 570a does. Therefore, when the alignment shift is compared with the conventional thin film transistor array 10, the alignment shift influences the channel region 17a in the thin film transistor array 10; however, the alignment shift influences only the second channel region 570a in the thin film transistor array 500. Therefore, the influence of the alignment shift in the thin film transistor array 500 is smaller than that in the thin film transistor array 10.

[Sixth Embodiment]

Next, a displaying apparatus using a thin film transistor array is described. When any one of the thin film transistor arrays 100 through 500 is used as a switching element (control element) for controlling a displaying status of an image displaying element, a displaying apparatus can be realized. As the image displaying element, for example, a polymer dispersion type liquid crystal element, an electrophoresis displaying element, and an organic EL element can be used. In the sixth embodiment of the present invention, a displaying apparatus using an electrophoresis displaying element is described.

Figure 12:
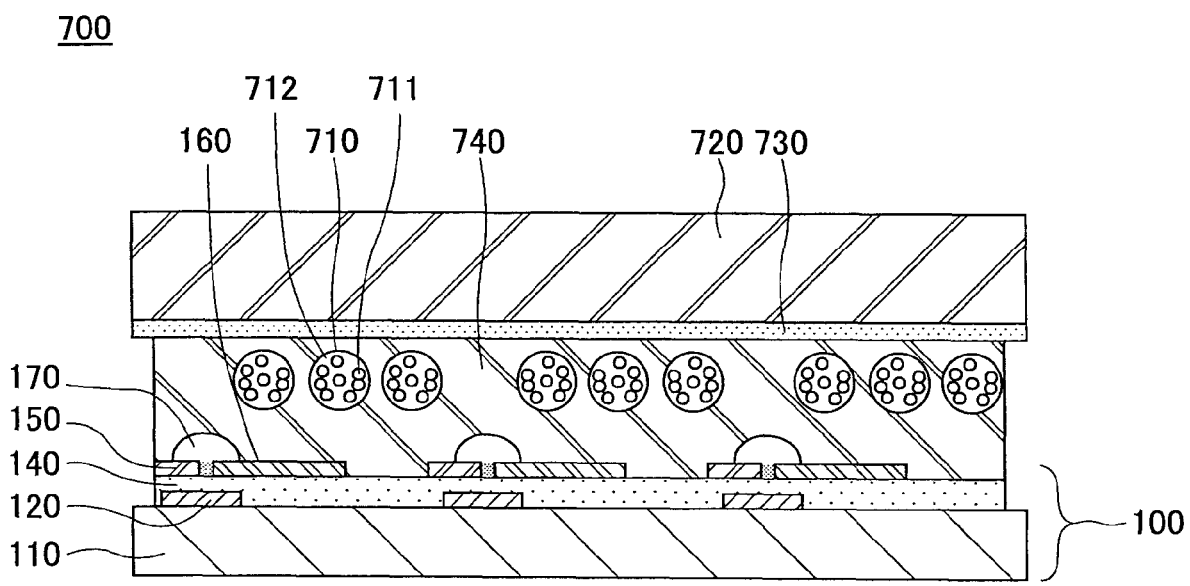
FIG. 12 is a cross-sectional view of a displaying apparatus using the thin film transistor array shown in FIG. 1.

FIG. 12 is a cross-sectional view of a displaying apparatus 700 using the thin film transistor array 100. In FIG. 12, when an element is similar to or the same as that shown in FIG. 1, the same reference number as that shown in FIG. 1 is used for the element, and the same description as that in FIG. 1 is omitted.

The displaying apparatus 700 includes microcapsules 710, a printed circuit board 720, a transparent electrode 730, and a PVA (polyvinyl alcohol) binder 740. The microcapsule 710 is an electrophoresis displaying element which contains titanium oxide particles and ISOPAR (brand name) colored by oil blue. The printed circuit board 720 is formed of, for example, polyethylene naphthalate and faces the insulation substrate 110. The transparent electrode 730 is formed of, for example, ITO (indium tin oxide) and has light transparency. The PVA binder 740 is a coating liquid in which a PVA water solution is mixed.

The displaying apparatus 700 can be formed by the following processes. First, the microcapsules 710 and the PVA binder 740 are applied onto the transparent electrode 730 formed on the printed circuit board 720; with this, a layer structure is formed. Then, the printed circuit board 720 on which the layer structure is formed is adhered onto the thin film transistor array 100 so that the printed circuit board 720 and the insulation substrate 110 are at the corresponding outer sides.

When a driver IC for a scanning signal is connected to the gate electrodes 120, and another driver IC for a data signal is connected to the source electrodes 150, the displaying apparatus 700 can display an image. Color of the image can be any color or full color. In the sixth embodiment of the present invention, the thin film transistor array 100 is used; however, any one of the thin film transistor arrays 100 through 500 can be used.

As described above, according to the sixth embodiment of the present invention, a displaying apparatus can be realized by combining any one of the thin film transistor arrays 100 through 500 with an image displaying element.

In addition, when a displaying apparatus using a thin film transistor array in the embodiments of the present invention is used as a displaying device in an apparatus, an information displaying system, for example, digital paper and a computer such as a pocket PC (personal computer) can be realized.

Figure 13:
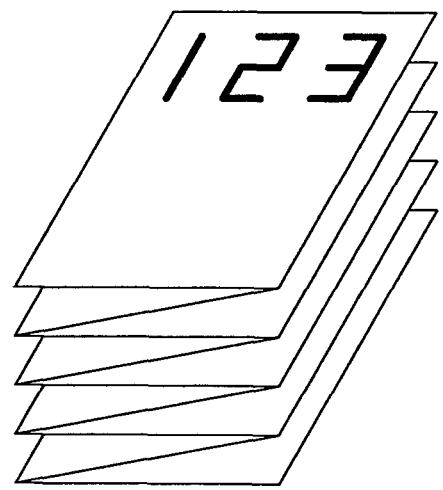
FIG. 13 is a perspective view of digital paper which uses a displaying apparatus using a thin film transistor array of the embodiment of the present invention.
Figure 14:
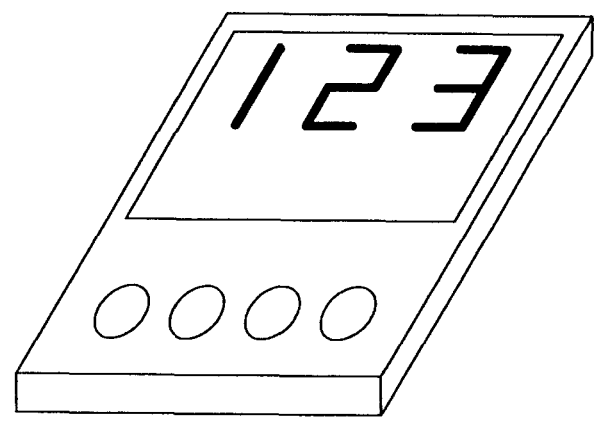
FIG. 14 is a perspective view of a pocket PC which uses a displaying apparatus using a thin film transistor array of the embodiment of the present invention.

FIG. 13 is a perspective view of digital paper which uses a displaying apparatus using a thin film transistor array of the embodiment of the present invention. FIG. 14 is a perspective view of a pocket PC which uses a displaying apparatus using a thin film transistor array of the embodiment of the present invention.

In FIGS. 13 and 14, examples are shown in which the displaying apparatus using the thin film transistor array of the embodiment of the present invention is used. In addition to the above, the thin film transistor array of the embodiment of the present invention can be used in a displaying device in an image forming apparatus, such as a copying apparatus, in a displaying device at a front windshield of a car or a seat of an airplane, or a price tag in a supermarket.

In the embodiments of the present invention, a bottom gate type thin film transistor array is described in which gate electrodes, a gate insulation film, source electrodes, and drain electrodes are sequentially stacked on an insulation substrate.

However, the embodiment of the present invention can be applied to a top gate type thin film transistor array in which source electrodes, drain electrodes, a gate insulation film, gate electrodes are sequentially stacked on an insulation substrate.

Further, the present invention is not limited to the specifically disclosed embodiments, and variations and modifications may be made without departing from the scope of the present invention.

The present invention is based on Japanese Priority Patent Application No. 2007-267845, filed on Oct. 15, 2007, with the Japanese Patent Office, the entire contents of which are hereby incorporated herein by reference.

What is claimed is:

1. A thin film transistor array, comprising:
    a plurality of gate electrodes formed on an insulation substrate;
    a plurality of source electrodes formed above or under the gate electrodes via a gate insulation film so that the source electrodes cross the gate electrodes in a planar view;
    a plurality of drain electrodes formed at corresponding positions surrounded by the gate electrodes and the source electrodes in a planar view in the same layer as that of the source electrodes;
    semiconductor layers formed via the gate insulation film to face the gate electrodes for forming corresponding channel regions between the source electrodes and the drain electrodes;
    wherein the plural gate electrodes are linearly formed, and the channel regions are disposed to face the gate electrodes,
    wherein common electrodes are formed under the source electrodes and the drain electrodes and in the same layer as that of the gate electrodes via the gate insulation film at positions facing the drain electrodes, wherein the common electrodes include incision parts disposed parallel to the gate electrodes and formed in regions overlapping the source electrodes in a planar view, and wherein the common electrode includes a corner part in a planar view and is formed under the source electrode and the drain electrode, and the corner part is formed not to overlap the source electrode and the drain electrode in a planar view.

2. The thin film transistor array as claimed in claim 1, wherein:
the semiconductor layers are electrically separated from each other.

3. The thin film transistor array as claimed in claim 1, wherein:
at least one of the gate electrodes, the source electrodes, and the drain electrodes is formed by a printing method.

4. A displaying apparatus, comprising:
the thin film transistor array as claimed in claim 1;
a printed circuit board; and
a displaying element.

5. The thin film transistor array as claimed in claim 1, wherein:
the channel region is formed between the corresponding source electrode and drain electrode and is disposed to face the corresponding gate electrode such that an electric field from the gate electrode is applied to the channel region.

6. The thin film transistor array as claimed in claim 2, wherein:
at least one of the gate electrodes, the source electrodes, and the drain electrodes is formed by a printing method.

7. A displaying apparatus, comprising:
the thin film transistor array as claimed in claim 2;
a printed circuit board; and
a displaying element.

8. A displaying apparatus, comprising:
the thin film transistor array as claimed in claim 3;
a printed circuit board; and
a displaying element.

* * * * *